(12) United States Patent
Inoue et al.

(10) Patent No.: US 12,400,825 B2
(45) Date of Patent: Aug. 26, 2025

(54) MULTI-ELECTRON BEAM IMAGE ACQUISITION APPARATUS, MULTI-ELECTRON BEAM INSPECTION APPARATUS, AND MULTI-ELECTRON BEAM IMAGE ACQUISITION METHOD

(71) Applicant: NuFlare Technology, Inc., Yokohama (JP)

(72) Inventors: Kazuhiko Inoue, Yokohama (JP); Munehiro Ogasawara, Hiratsuka (JP)

(73) Assignee: NuFlare Technology, Inc., Yokohama (JP)

( * ) Notice: Subject to any disclaimer, the term of this patent is extended or adjusted under 35 U.S.C. 154(b) by 463 days.

(21) Appl. No.: 17/897,267

(22) Filed: Aug. 29, 2022

(65) Prior Publication Data
US 2023/0102715 A1     Mar. 30, 2023

(30) Foreign Application Priority Data
Sep. 24, 2021 (JP) ................. 2021-155770

(51) Int. Cl.
H01J 37/141     (2006.01)
G01N 23/2251    (2018.01)
H01J 37/244     (2006.01)

(52) U.S. Cl.
CPC ...... *H01J 37/1413* (2013.01); *G01N 23/2251* (2013.01); *H01J 37/244* (2013.01); *H01J 2237/2448* (2013.01)

(58) Field of Classification Search
CPC .............. H01J 37/1413; H01J 37/244; H01J 2237/2448; H01J 37/141; H01J 37/265; H01J 37/28; G01N 23/2251
See application file for complete search history.

(56) References Cited

U.S. PATENT DOCUMENTS 7,135,675 B1 * 11/2006 Adler ............... H01J 37/26
                                                 250/306
12,211,669 B2 * 1/2025 Ren ................. H01J 37/3177
(Continued)

FOREIGN PATENT DOCUMENTS

| CN | 109585244 A | 4/2019 |
|---|---|---|
| JP | 2-21552 A | 1/1990 |

(Continued)

OTHER PUBLICATIONS

Japanese Office Action issued Apr. 15, 2025 in Japanese Patent Application No. 2021-155770 (with unedited computer-generated English Translation), 4 pages.

*Primary Examiner* — David A Vanore
(74) *Attorney, Agent, or Firm* — Oblon, McClelland, Maier & Neustadt, L.L.P.

(57) ABSTRACT

A multi-electron beam image acquisition apparatus includes a first electromagnetic lens configured to focus multiple primary electron beams to form an image on a substrate, and a second electromagnetic lens configured to be able to variably adjust a peak position of a magnetic field distribution in a direction of a trajectory central axis of multiple secondary electron beams, and to focus the multiple secondary electron beams to form an image on either one of a detection surface of a detector and a position conjugate to the detection surface. The first electromagnetic lens focuses, to form an image, the multiple secondary electron beams before they are separated from the multiple primary electron beams, and the second electromagnetic lens is arranged between a separator which separates the multiple secondary electron beams and an image forming point on which the multiple secondary electron beams are focused by the first electromagnetic lens.

10 Claims, 12 Drawing Sheets

(56) References Cited

U.S. PATENT DOCUMENTS

| | | | | |
|---|---|---|---|---|
| 2002/0088940 A1* | 7/2002 | Watanabe | H01J 37/224 | 250/310 |
| 2002/0142496 A1* | 10/2002 | Nakasuji | G01N 23/2251 | 250/492.3 |
| 2003/0030007 A1* | 2/2003 | Karimata | H01J 37/12 | 250/396 R |
| 2003/0168606 A1* | 9/2003 | Adamec | H01J 37/09 | 250/396 R |
| 2004/0159787 A1* | 8/2004 | Nakasuji | H01J 37/28 | 250/311 |
| 2006/0102838 A1* | 5/2006 | Nakasuji | G01N 23/2251 | 250/307 |
| 2007/0045534 A1* | 3/2007 | Zani | H01J 37/3174 | 257/E21.336 |
| 2008/0099697 A1* | 5/2008 | Watanabe | H01J 37/026 | 250/492.22 |
| 2009/0014649 A1* | 1/2009 | Nakasuji | H01J 37/153 | 250/310 |
| 2009/0212213 A1* | 8/2009 | Nakasuji | H01J 37/28 | 250/442.11 |
| 2010/0213370 A1* | 8/2010 | Nakasuji | H01J 37/226 | 250/310 |
| 2011/0220795 A1* | 9/2011 | Frosien | H01J 37/147 | 250/307 |
| 2011/0272576 A1* | 11/2011 | Otaki | B82Y 40/00 | 250/306 |
| 2012/0061565 A1* | 3/2012 | Enyama | H01J 37/28 | 250/307 |
| 2012/0091332 A1* | 4/2012 | Makarov | H01J 49/40 | 250/281 |
| 2017/0032952 A1* | 2/2017 | Verenchikov | H01J 49/0031 | |
| 2017/0084423 A1* | 3/2017 | Masnaghetti | H01J 37/09 | |
| 2017/0084424 A1* | 3/2017 | Masnaghetti | H01J 37/28 | |
| 2017/0243717 A1 | 8/2017 | Kruit | | |
| 2017/0263413 A1* | 9/2017 | Frosien | H01J 37/21 | |
| 2018/0261424 A1* | 9/2018 | Tsuchiya | H01J 37/28 | |
| 2019/0035595 A1* | 1/2019 | Ren | H01J 37/1472 | |
| 2019/0051487 A1* | 2/2019 | Ogasawara | H01J 37/3177 | |
| 2019/0088440 A1* | 3/2019 | Zeidler | H01J 37/09 | |
| 2019/0096631 A1* | 3/2019 | Takekoshi | H01J 37/22 | |
| 2019/0164721 A1* | 5/2019 | Shaked | H01J 37/28 | |
| 2019/0195815 A1* | 6/2019 | Kikuiri | H01J 37/244 | |
| 2019/0214221 A1* | 7/2019 | Ishii | H01J 37/244 | |
| 2019/0259564 A1* | 8/2019 | Kruit | H01J 37/1475 | |
| 2019/0277782 A1* | 9/2019 | Tsuchiya | H01J 37/265 | |
| 2019/0333732 A1* | 10/2019 | Ren | H01J 37/145 | |
| 2019/0355546 A1* | 11/2019 | Ando | H01J 37/141 | |
| 2019/0355547 A1* | 11/2019 | Ando | H01J 37/28 | |
| 2019/0360951 A1* | 11/2019 | Ogawa | G01N 23/04 | |
| 2019/0362928 A1* | 11/2019 | Inoue | H01J 37/141 | |
| 2019/0378676 A1* | 12/2019 | Hartley | H01J 37/1471 | |
| 2020/0006031 A1* | 1/2020 | Izumi | H01J 37/16 | |
| 2020/0013585 A1* | 1/2020 | Inoue | H01J 37/28 | |
| 2020/0035452 A1* | 1/2020 | Bennahmias | H01J 37/04 | |
| 2020/0051779 A1* | 2/2020 | Ren | H01J 37/10 | |
| 2020/0104980 A1* | 4/2020 | Inoue | H01J 37/21 | |
| 2020/0124546 A1* | 4/2020 | Hu | H01J 37/32321 | |
| 2020/0126752 A1* | 4/2020 | Brodie | H01J 37/12 | |
| 2020/0161082 A1* | 5/2020 | Inoue | H01J 37/222 | |
| 2020/0168430 A1* | 5/2020 | Inoue | H01J 37/12 | |
| 2020/0176216 A1* | 6/2020 | Inoue | H01J 37/20 | |
| 2020/0211811 A1* | 7/2020 | Ren | H01J 37/28 | |
| 2020/0211812 A1* | 7/2020 | Inoue | H01J 37/3177 | |
| 2020/0234919 A1* | 7/2020 | Sugihara | H01J 37/3177 | |
| 2020/0258714 A1* | 8/2020 | Cook | H01J 37/265 | |
| 2020/0286705 A1* | 9/2020 | Liu | H01J 37/04 | |
| 2020/0286709 A1* | 9/2020 | Shiratsuchi | H01J 37/22 | |
| 2020/0317504 A1* | 10/2020 | Wang | H01J 37/12 | |
| 2020/0321191 A1* | 10/2020 | Ren | H01J 37/3177 | |
| 2020/0381207 A1* | 12/2020 | Ren | H01J 37/28 | |
| 2020/0381211 A1* | 12/2020 | Ren | H01J 37/145 | |
| 2020/0381212 A1* | 12/2020 | Ren | H01J 37/12 | |
| 2020/0388462 A1* | 12/2020 | Nguyen | H01J 37/222 | |
| 2020/0394778 A1* | 12/2020 | Yoshitake | G21K 7/00 | |
| 2020/0395189 A1* | 12/2020 | Inoue | H01J 37/09 | |
| 2021/0005422 A1* | 1/2021 | Nakashima | H01J 37/3177 | |
| 2021/0193437 A1* | 6/2021 | Ren | H01J 37/292 | |
| 2021/0202206 A1* | 7/2021 | Takekoshi | H01J 37/265 | |
| 2021/0217582 A1* | 7/2021 | Maassen | H01J 37/28 | |
| 2021/0319977 A1* | 10/2021 | Liu | H01J 37/1474 | |
| 2022/0230837 A1* | 7/2022 | Inoue | H01J 37/05 | |
| 2022/0299456 A1* | 9/2022 | Ogawa | G01N 23/2251 | |
| 2022/0301811 A1* | 9/2022 | Fang | H01J 37/222 | |
| 2022/0336183 A1* | 10/2022 | Ishii | H01J 37/1477 | |
| 2022/0359149 A1* | 11/2022 | Sakakibara | H01J 37/141 | |
| 2022/0365010 A1* | 11/2022 | Ishii | G01N 23/225 | |
| 2022/0415611 A1* | 12/2022 | Steenbrink | H01J 37/3177 | |
| 2023/0037583 A1* | 2/2023 | Wieland | H01J 37/153 | |
| 2023/0048580 A1* | 2/2023 | Mangnus | H01J 37/153 | |
| 2023/0077403 A1* | 3/2023 | Inoue | H01J 37/244 | 250/306 |
| 2023/0080062 A1* | 3/2023 | Ishii | H01J 37/28 | 250/307 |
| 2023/0102715 A1* | 3/2023 | Inoue | H01J 37/244 | 250/307 |
| 2023/0113062 A1* | 4/2023 | Ando | H01J 37/20 | 250/310 |
| 2023/0136198 A1* | 5/2023 | Akiba | H01J 37/145 | 250/310 |
| 2023/0207253 A1* | 6/2023 | Wieland | H01J 37/26 | 250/307 |
| 2023/0207259 A1* | 6/2023 | Slot | H01J 37/3045 | 250/491.1 |
| 2023/0238211 A1* | 7/2023 | Wieland | H01L 27/1443 | 250/396 R |
| 2023/0298850 A1* | 9/2023 | Scotuzzi | H01J 37/28 | 250/307 |
| 2023/0304949 A1* | 9/2023 | Veenstra | H01J 37/244 | |
| 2023/0335368 A1* | 10/2023 | Ogasawara | H01J 37/06 | |
| 2024/0071716 A1* | 2/2024 | Wieland | H01J 37/226 | |
| 2024/0079200 A1* | 3/2024 | Inoue | H01J 37/244 | |
| 2024/0087842 A1* | 3/2024 | Wieland | H01J 37/222 | |
| 2024/0128045 A1* | 4/2024 | Slot | H01J 37/28 | |
| 2024/0136147 A1* | 4/2024 | Slot | H01J 37/141 | |
| 2024/0170248 A1* | 5/2024 | Podhola | H01J 29/563 | |
| 2024/0186106 A1* | 6/2024 | Wang | H01J 37/244 | |
| 2024/0210336 A1* | 6/2024 | Van Lare | G03F 7/70655 | |
| 2024/0242921 A1* | 7/2024 | Osterberg | H01J 37/04 | |
| 2024/0282547 A1* | 8/2024 | Ishii | H01J 37/1471 | |
| 2024/0339290 A1* | 10/2024 | Van Soest | H01J 37/28 | |
| 2025/0014855 A1* | 1/2025 | Wieland | H01J 37/12 | |

FOREIGN PATENT DOCUMENTS

| | | |
|---|---|---|
| JP | 2-284340 A | 11/1990 |
| JP | 2004-363003 A | 12/2004 |
| JP | 2005-158642 A | 6/2005 |
| JP | 2007-317467 A | 12/2007 |
| JP | 2020-9755 A | 1/2020 |
| JP | 2020-528197 A | 9/2020 |
| JP | 2021-197263 A | 12/2021 |
| JP | 2022-096502 A | 6/2022 |
| JP | 2022-112409 A | 8/2022 |
| KR | 10-2020-0015425 A | 2/2020 |
| KR | 10-2020-0047479 A | 5/2020 |

* cited by examiner

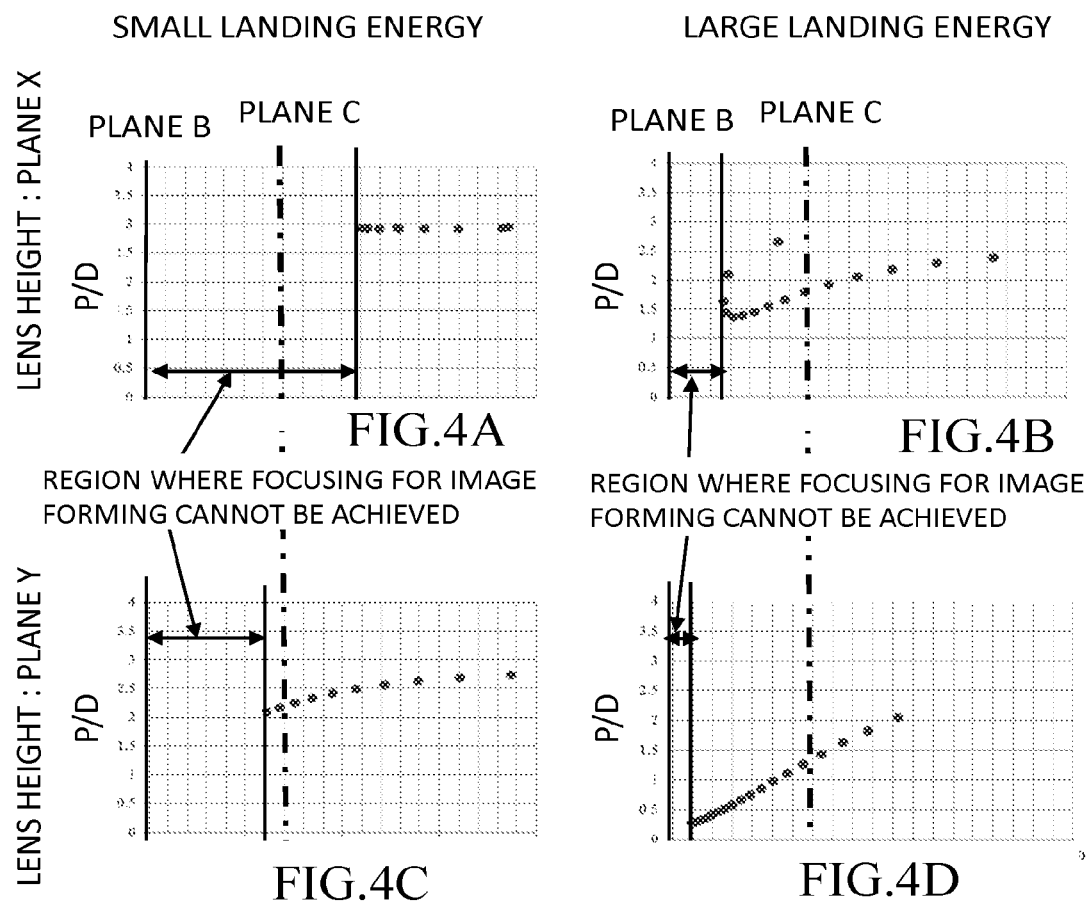

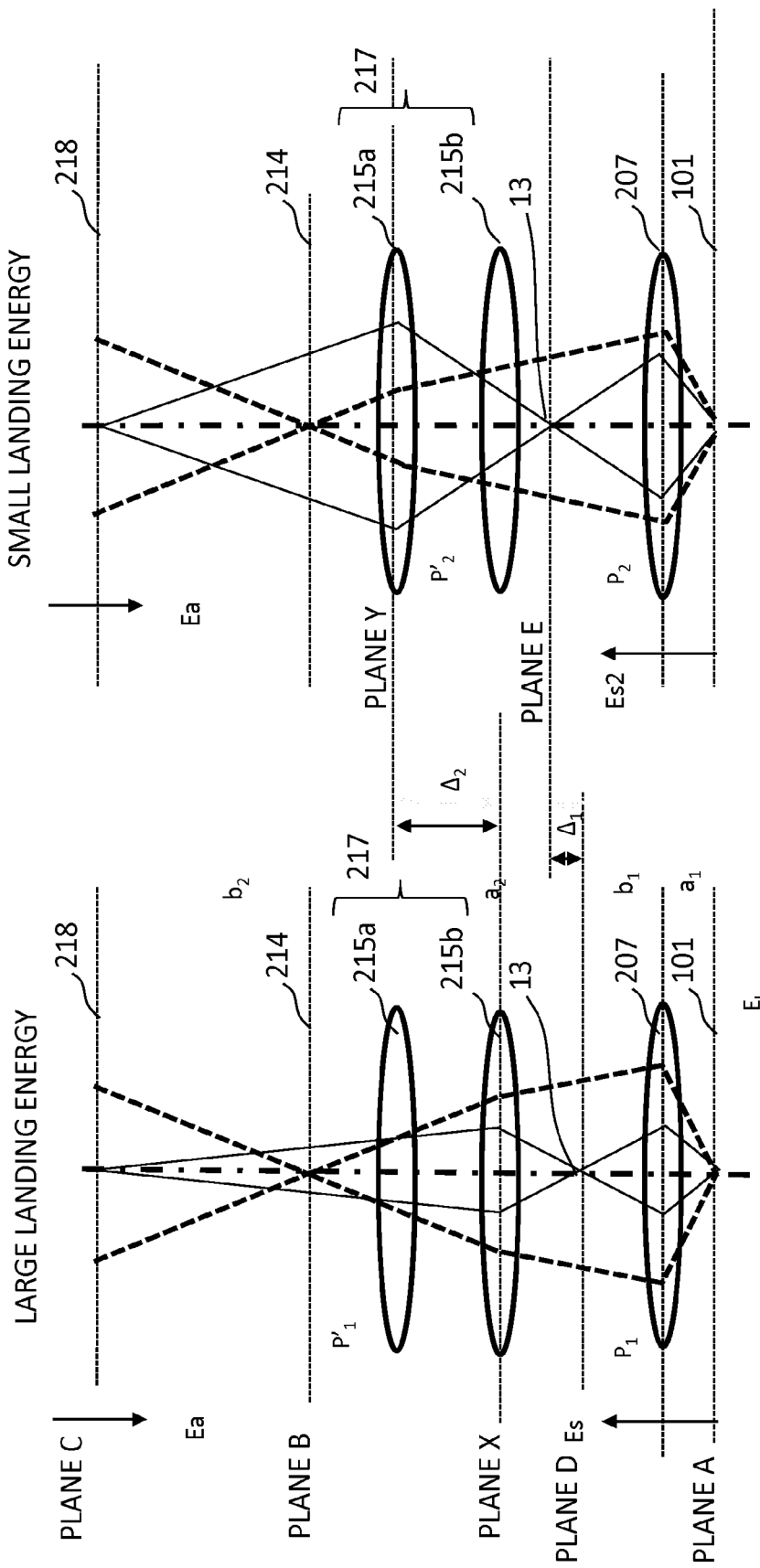

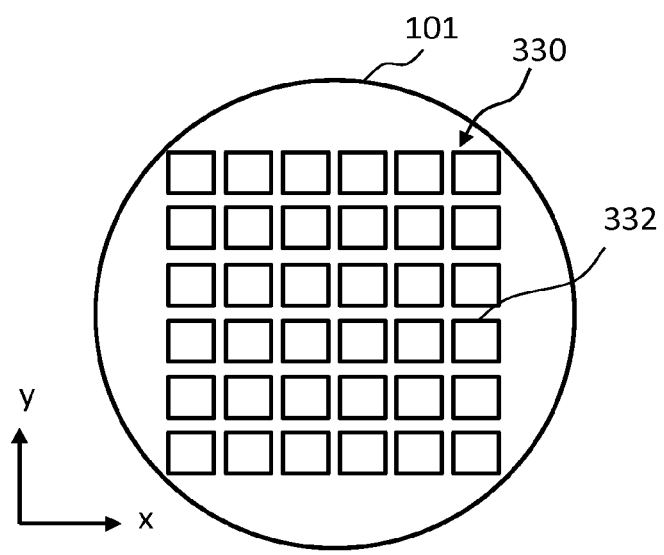
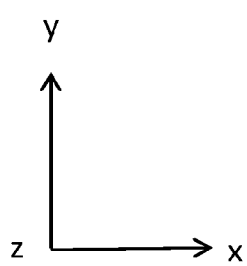
FIG.12

MULTI-ELECTRON BEAM IMAGE ACQUISITION APPARATUS, MULTI-ELECTRON BEAM INSPECTION APPARATUS, AND MULTI-ELECTRON BEAM IMAGE ACQUISITION METHOD

CROSS-REFERENCE TO RELATED APPLICATION

This application is based upon and claims the benefit of priority from prior Japanese Patent Application No. 2021-155770 filed on Sep. 24, 2021 in Japan, the entire contents of which are incorporated herein by reference.

BACKGROUND OF THE INVENTION

Field of the Invention

Embodiments of the present invention relate to a multi-electron beam image acquisition apparatus, a multi-electron beam inspection apparatus, and a multi-electron beam image acquisition method, and for example, relates to a method for acquiring an image by applying multiple primary electron beams to a substrate and detecting multiple secondary electron beams emitted from the substrate.

Description of Related Art

With recent progress in high integration and large capacity of the LSI (Large Scale Integrated circuits), the line width (critical dimension) required for circuits of semiconductor elements is becoming increasingly narrower. Since LSI manufacturing requires an enormous production cost, it is essential to improve the yield. Meanwhile, as typified by 1 gigabit DRAMs (Dynamic Random Access Memories), the size of patterns that make up the LSI is reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultra-fine patterns exposed/transferred onto a semiconductor wafer needs to be highly accurate. Further, one of major factors that decrease the yield of the LSI manufacturing is due to pattern defects on a mask for exposing/transferring an ultrafine pattern onto the semiconductor wafer by the photolithography technology. Therefore, the pattern inspection apparatus for inspecting defects on an exposure transfer mask used in manufacturing LSI also needs to be highly accurate.

The inspection apparatus acquires a pattern image by, for example, irradiating an inspection target substrate with multiple electron beams, and individually detecting, by a multi-detector, a secondary electron corresponding to each beam emitted from the inspection target substrate. As an inspection method, there is known a method of comparing a measured image acquired by imaging a pattern formed on a substrate with design data or with another measured image acquired by imaging an identical pattern on the same substrate. For example, as a pattern inspection method, there is "die-to-die inspection" or "die-to-database inspection". Specifically, the "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In image acquisition using electron beams, there is an optimal landing energy (incident energy) depending on the yield of a target object to be inspected. Therefore, when acquiring images, the landing energy needs to be changed in accordance with the target object. Regarding this, an optical system is disclosed in which two lenses are arranged between an E×B separator and a target object (e.g., refer to Japanese Patent Application Laid-open (JP-A) No. 2004-363003). In the configuration according to what is disclosed, when the landing energy is changed, the two lenses between the E×B separator and the target object need to focus a primary electron beam to form an image on the surface of the target object, and focus a secondary electron beam to form an image at a desired position. However, there occurs a problem that, when focusing a primary electron beam to form an image on the target object surface and focusing a secondary electron beam to form an image at a desired position by the optical system fixed to a predetermined position, it may not be possible, depending on the amount of landing energy, for that system to achieve focusing and imaging. Further, even if focusing and forming an image has been achieved, there is a problem that, depending on the amount of landing energy, a crosstalk may occur between beams of multiple secondary electron beams.

BRIEF SUMMARY OF THE INVENTION

According to one aspect of the present invention, a multi-electron beam image acquisition apparatus includes a stage on which a substrate is to be mounted, an emission source configured to emit multiple primary electron beams, a first electromagnetic lens configured to focus the multiple primary electron beams to form an image on the substrate, a separator configured to separate multiple secondary electron beams, which are emitted from the substrate due to irradiation with the multiple primary electron beams, from the multiple primary electron beams, a detector configured to detect the multiple secondary electron beams having been separated, and a second electromagnetic lens configured to be able to variably adjust a peak position of a magnetic field distribution in a direction of a trajectory central axis of the multiple secondary electron beams, and to focus the multiple secondary electron beams to form an image on either one of a detection surface of the detector and a position conjugate to the detection surface, wherein the first electromagnetic lens focuses, to form an image, the multiple secondary electron beams in a state before being separated from the multiple primary electron beams, and the second electromagnetic lens is arranged between the separator and an image forming point on which the multiple secondary electron beams are focused by the first electromagnetic lens.

According to another aspect of the present invention, a multi-electron beam inspection apparatus includes a stage on which a substrate is to be mounted, an emission source configured to emit multiple primary electron beams, a first electromagnetic lens configured to focus the multiple primary electron beams to form an image on the substrate, a separator configured to separate multiple secondary electron beams, which are emitted from the substrate due to irradiation with the multiple primary electron beams, from the multiple primary electron beams, a detector configured to detect the multiple secondary electron beams having been separated, a second electromagnetic lens configured to be able to variably adjust a peak position of a magnetic field distribution in a direction of a trajectory central axis of the multiple secondary electron beams, and to focus the multiple secondary electron beams to form an image on either one of a detection surface of the detector and a position conjugate to the detection surface, and a comparison circuit configured to compare an image acquired by detecting the multiple secondary electron beams by the detector with a reference image, wherein the first electromagnetic lens focuses, to form an image, the multiple secondary electron beams in a state before being separated from the multiple primary electron beams, and the second electromagnetic lens is arranged between the separator and an image forming point on which the multiple secondary electron beams are focused by the first electromagnetic lens.

According to yet another aspect of the present invention, a multi-electron beam image acquisition method includes emitting multiple primary electron beams, focusing, by a first electromagnetic lens, the multiple primary electron beams to form an image on a substrate mounted on a stage, separating, by a separator, multiple secondary electron beams, which are emitted from the substrate due to irradiation with the multiple primary electron beams, from the multiple primary electron beams, detecting, by a detector, the multiple secondary electron beams having been separated, and focusing the multiple secondary electron beams to form an image on either one of a detection surface of the detector and a position conjugate to the detection surface, by using a second electromagnetic lens which can variably adjust a peak position of a magnetic field distribution in a direction of a trajectory central axis of the multiple secondary electron beams, wherein the first electromagnetic lens focuses, to form an image, the multiple secondary electron beams in a state before being separated from the multiple primary electron beams, and the second electromagnetic lens is arranged between the separator and an image forming point on which the multiple secondary electron beams are focused by the first electromagnetic lens.

BRIEF DESCRIPTION OF THE DRAWINGS

FIGS. 4A to 4D are graphs each showing an example of change of a ratio of a beam pitch to a beam diameter according to a comparative example of the first embodiment;

FIGS. 5A and 5B are illustrations showing an example of a trajectory of a primary electron beam and that of a secondary electron beam according to the first embodiment;

FIG. 12 is an illustration showing an example of a plurality of chip regions formed on a semiconductor substrate, according to the first embodiment;

DETAILED DESCRIPTION OF THE INVENTION

In the following, embodiments of the present invention provide an apparatus and method that can, even when the landing energy is variably adjusted, focus a primary electron beam to form an image on the surface of a target object, and focus a secondary electron beam to form an image at a desired position without generating a crosstalk between beams.

The embodiments below describe, as an example of a multi-electron beam image acquisition apparatus, an inspection apparatus using multiple electron beams. However, it is not limited thereto. Any apparatus can be used that acquires an image by irradiating a substrate with multiple primary electron beams to use multiple secondary electron beams emitted from the substrate due to the irradiation.

First Embodiment

Figure 1:
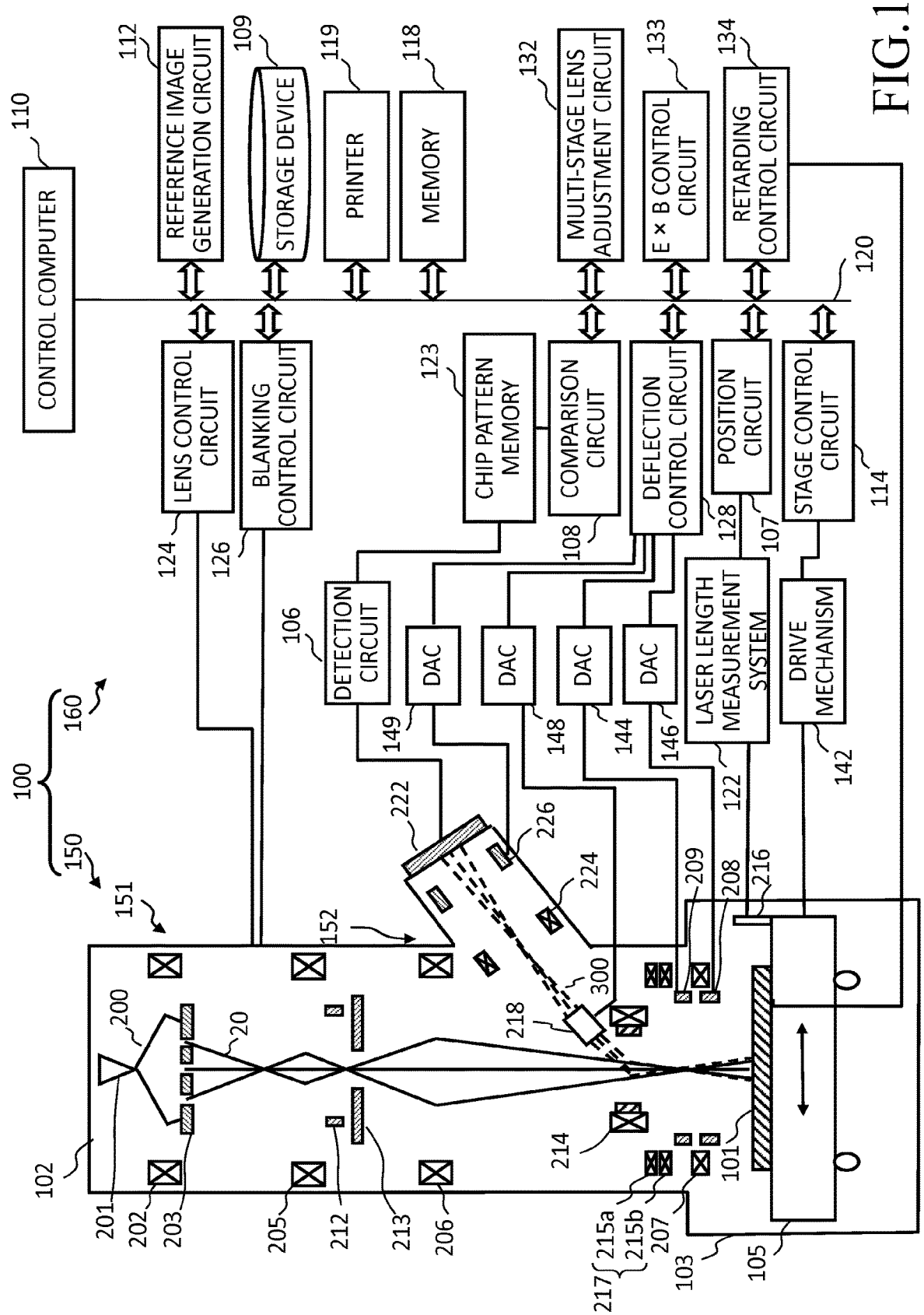
FIG. 1 is a diagram showing a configuration of an inspection apparatus according to a first embodiment.

FIG. 1 is a diagram showing an example of a configuration of an inspection apparatus according to a first embodiment. In FIG. 1, an inspection apparatus 100 for inspecting a pattern formed on the substrate is an example of a multi-electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a bundle blanking deflector 212, a limiting aperture substrate 213, an electromagnetic lens 206, a multi-stage electromagnetic lens 217 (pre multi-stage objective lens), an electromagnetic lens 207 (objective lens), a main deflector 208, a sub deflector 209, an ExB separator 214 (beam separator), a deflector 218, an electromagnetic lens 224, a deflector 226, and a multi-detector 222. A primary electron optical system 151 (illumination optical system) is composed of the electron gun 201, the electromagnetic lens 202, the shaping aperture array substrate 203, the electromagnetic lens 205, the bundle blanking deflector 212, the limiting aperture substrate 213, the electromagnetic lens 206, the multi-stage electromagnetic lens 217, the electromagnetic lens 207 (objective lens), the main deflector 208, and the sub deflector 209. A secondary electron optical system 152 (detection optical system) is composed of the electromagnetic lens 207, electromagnetic lenses 215a and 215b of a two-stage array, the E×B separator 214, the deflector 218, the electromagnetic lens 224, and the deflector 226.

Although the two-stage electromagnetic lens of the electromagnetic lens 215a and the electromagnetic lens 215b is shown as the multi-stage electromagnetic lens 217 in FIG. 1, three or more stage electromagnetic lens may be used.

In the inspection chamber 103, there is disposed a stage 105 movable at least in the x and y directions. On the stage 105, a substrate 101 (target object) to be inspected is placed. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed and transferred onto the semiconductor substrate a plurality of times, a plurality of chip patterns (wafer dies) are formed on the semiconductor substrate. The case of the substrate 101 being a semiconductor substrate is mainly described below. The substrate 101 is placed, with its pattern-forming surface facing upward, on the stage 105, for example. Further, on the stage 105, there is disposed a mirror 216 which reflects a laser beam for measuring a laser length emitted from a laser length measuring system 122 arranged outside the inspection chamber 103.

The multi-detector 222 is connected, at the outside of the electron beam column 102, to a detection circuit 106. The detection circuit 106 is connected to a chip pattern memory 123.

The multi-detector 222 includes a plurality of detection elements arranged in an array.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a multi-stage lens adjustment circuit 132, an E×B control circuit 133, a retarding control circuit 134, a storage device 109 such as a magnetic disk drive, a memory 118, and a printer 119. The deflection control circuit 128 is connected to DAC (digital-to-analog conversion) amplifiers 144, 146, 148 and 149. The DAC amplifier 146 is connected to the main deflector 208, the DAC amplifier 144 is connected to the sub deflector 209, the DAC amplifier 148 is connected to the deflector 218, and the DAC amplifier 149 is connected to the deflector 226.

The chip pattern memory 123 is connected to the comparison circuit 108 and the retarding control circuit 134. The stage 105 is driven by a drive mechanism 142 under the control of the stage control circuit 114. In the drive mechanism 142, a drive system such as a three (x-, y-, and θ-) axis motor which provides drive in the directions of x, y, and θ in the stage coordinate system is configured, and therefore, the stage 105 can be moved in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. With respect to the stage coordinate system, the x, y, and θ directions of the primary coordinate system are set, for example, to a plane perpendicular to the optical axis of the multiple primary electron beams 20.

The retarding control circuit 134 applies a retarding potential to the substrate 101. Here, a negative retarding potential is applied.

The electromagnetic lenses 202, 205, 206, 207, and 224, and the multi-stage electromagnetic lens 217 are controlled by the lens control circuit 124. With respect to adjusting the electromagnetic lens 207 and the multi-stage electromagnetic lens 217, the lens control circuit 124 is controlled by the multi-stage lens adjustment circuit 132.

The E×B separator 214 is controlled by the E×B control circuit 133. The bundle blanking deflector 212 is an electrostatic deflector composed of two or more electrodes (or poles), and each electrode is controlled by the blanking control circuit 126 through a DAC amplifier (not shown). The sub deflector 209 is an electrostatic deflector composed of four or more electrodes (or poles), and each electrode is controlled by the deflection control circuit 128 through the DAC amplifier 144. The main deflector 208 is an electrostatic deflector composed of four or more electrodes (or poles), and each electrode is controlled by the deflection control circuit 128 through the DAC amplifier 146. The deflector 218 is an electrostatic deflector composed of four or more electrodes (or poles), and each electrode is controlled by the deflection control circuit 128 through the DAC amplifier 148. The deflector 226 is an electrostatic deflector composed of four or more electrodes (or poles), and each electrode is controlled by the deflection control circuit 128 through the DAC amplifier 149.

To the electron gun 201, there is connected a high voltage power supply circuit (not shown). The high voltage power supply circuit applies an acceleration voltage between a filament (cathode) (not shown) and an extraction electrode (anode) (not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows configuration elements necessary for describing the first embodiment. Other configuration elements generally necessary for the inspection apparatus 100 may also be included therein.

Figure 2:
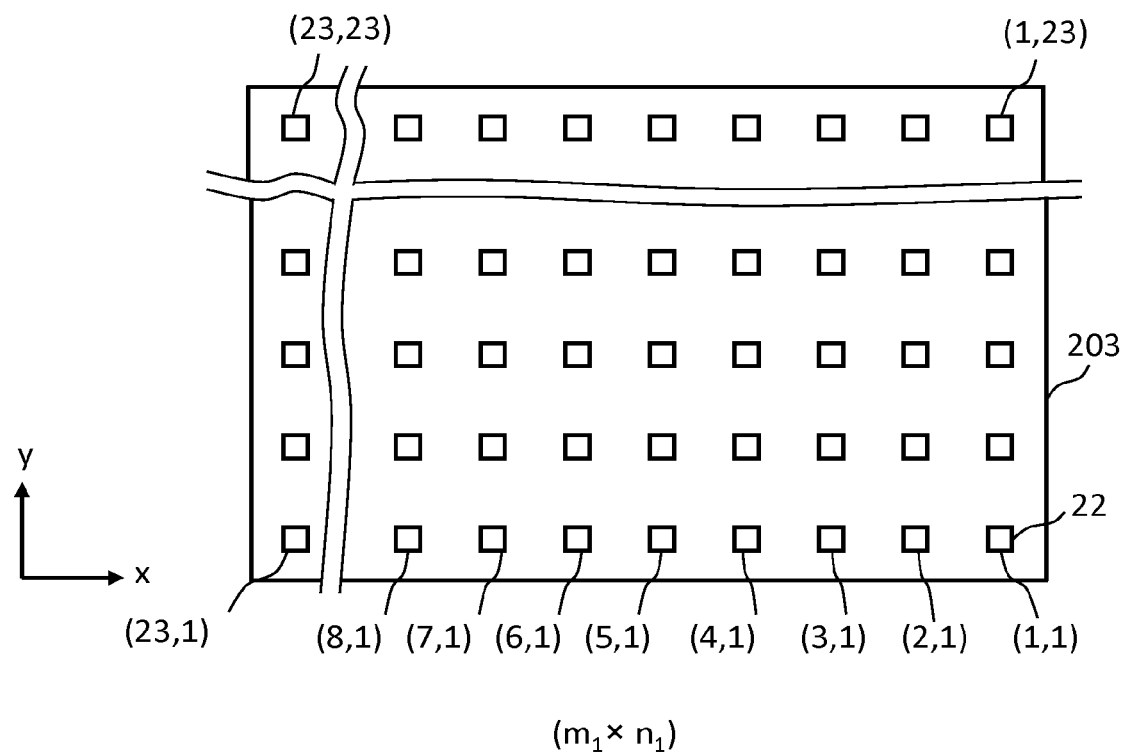
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ columns wide (width in the x direction) and $n_1$ rows long (length in the y direction), where each of $m_1$ and $n_1$ is an integer of 2 or more, are two-dimensionally formed in the x and y directions at a predetermined arrangement pitch in the shaping aperture array substrate 203. In the case of FIG. 2, 23×23 holes (openings) 22 are formed. Each of the holes 22 is a rectangle (including a square) having the same dimension, shape, and size. Alternatively, each of the holes 22 may be a circle with the same outer diameter. The shaping aperture array substrate 203 is an example of an emission source which emits multiple primary electron beams. The shaping aperture array substrate 203 forms and emits the multiple primary electron beams 20. Concretely, the multiple primary electron beams 20 are formed by letting portions of the electron beam 200 individually pass through a corresponding one of the plurality of holes 22. Next, operations of the image acquisition mechanism 150 when acquiring a secondary electron image will be described below. In the primary electron optical system 151, the substrate 101 is irradiated with the multiple primary electron beams 20. Specifically, it operates as follows:

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated with the electron beam 200. The multiple primary electron beams 20 are formed by letting portions of the electron beam 200 applied to the positions of the plurality of holes 22 individually pass through a corresponding one of the plurality of holes 22 in the shaping aperture array substrate 203.

The formed multiple primary electron beams 20 are individually refracted by the electromagnetic lenses 205 and 206, and travel to the multi-stage electromagnetic lens 217 and the electromagnetic lens 207 (objective lens), while repeating forming an intermediate image and a crossover, passing through the E×B separator 214 arranged in the intermediate image plane of each beam of the multiple primary electron beams 20.

When the multiple primary electron beams 20 are incident on the electromagnetic lens 207 (objective lens), the electromagnetic lens 207 focuses the multiple primary electron beams 20 to form an image on the substrate 101. The multiple primary electron beams 20 having been focused on the substrate 101 (target object) by the electromagnetic lens 207 are collectively deflected by the main deflector 208 and the sub deflector 209 to irradiate respective beam irradiation positions on the substrate 101. In the case where all of the multiple primary electron beams 20 are collectively deflected by the bundle blanking deflector 212, they deviate from the hole in the center of the limiting aperture substrate 213 and are blocked by the limiting aperture substrate 213. On the other hand, the multiple primary electron beams 20 which were not deflected by the bundle blanking deflector 212 pass through the hole in the center of the limiting aperture substrate 213 as shown in FIG. 1. Blanking control is provided by On/Off of the bundle blanking deflector 212, and thus On/Off of the multiple beams is collectively controlled. In this way, the limiting aperture substrate 213 blocks the multiple primary electron beams 20 which were deflected to be in an "Off state" by the bundle blanking deflector 212. Then, the multiple primary electron beams 20 for image acquisition are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons, each corresponding to each of the multiple primary electron beams 20, is emitted from the substrate 101 due to the irradiation with the multiple primary electron beams 20.

The multiple secondary electron beams 300 emitted from the substrate 101 pass through the electromagnetic lens 207, and form an intermediate image plane. The multiple secondary electron beams 300, passing through the intermediate image plane position and the multi-stage electromagnetic lens 217, travel to the E×B separator 214. Then, the multiple secondary electron beams 300 form, by the multi-stage electromagnetic lens 217, another intermediate image plane at the downstream side from the E×B separator 214 in the secondary trajectory of the secondary electron optical system.

The E×B separator 214 includes a plurality of, at least two, magnetic poles each having a coil, and a plurality of, at least two, electrodes (poles). For example, the E×B separator 214 includes four magnetic poles (electromagnetic deflection coils) whose phases are mutually shifted by 90°, and four electrodes (electrostatic deflection electrodes) whose phases are also mutually shifted by 90°. For example, by setting two opposing magnetic poles to be an N pole and an S pole, a directive magnetic field is generated by these plurality of magnetic poles. Also, for example, by applying electrical potentials V whose signs are opposite to each other to the two opposing electrodes, a directive electric field is generated by these plurality of electrodes. Specifically, the E×B separator 214 generates an electric field and a magnetic field to be orthogonal to each other in a plane perpendicular to the traveling direction of the center beam (i.e., trajectory center axis) of the multiple primary electron beams 20. The electric field exerts a force in a fixed direction regardless of the traveling direction of electrons. In contrast, the magnetic field exerts a force according to Fleming's left-hand rule. Therefore, the direction of the force acting on (applied to) electrons can be changed depending on the entering (or "traveling") direction of electrons. With respect to the multiple primary electron beams 20 entering the E×B separator 214 from above, since the forces due to the electric field and the magnetic field cancel each other out, the beams 20 travel straight downward. In contrast, with respect to the multiple secondary electron beams 300 entering the E×B separator 214 from below, since both the forces due to the electric field and the magnetic field are exerted in the same direction, the beams 300 are bent obliquely upward, and separated from the trajectory of the multiple primary electron beams 20.

The multiple secondary electron beams 300 having been bent obliquely upward travel to the deflector 218, and forms an intermediate image plane at the intermediate (center) height position of the deflector 218. In other words, the multiple secondary electron beams 300 are focused on the intermediate position of the deflector 218 by the multi-stage electromagnetic lens 217.

The multiple secondary electron beams 300 having been bent obliquely upward are further bent by the deflector 218, travel to the electromagnetic lens 224, and form a crossover at the intermediate position of the electromagnetic lens 224. The multiple secondary electron beams 300 are projected onto the multi-detector 222 while being refracted by the electromagnetic lens 224.

The multi-detector 222 detects the projected multiple secondary electron beams 300. At the detection surface of the multi-detector 222, since each beam of the multiple primary electron beams 20 collides with a detection element corresponding to each of the multiple secondary electron beams 300, electron amplification occurs, and secondary electron image data is generated for each pixel. An intensity signal detected by the multi-detector 222 is output to the detection circuit 106. A sub-irradiation region on the substrate 101, which is surrounded by the beam pitch in the x direction and the beam pitch in the y direction and in which the beam concerned itself is located, is irradiated with each primary electron beam, and the inside of the sub-irradiation region is scanned with each primary electron beam.

In image acquisition using electron beams, there is an optimal landing energy depending on the yield of a target object to be inspected, where the yield indicates a ratio of the secondary electron emission amount to the primary electron incident amount. As shown in the equation (1) below, a landing energy El can be defined by a value obtained by subtracting an energy Es which decelerates a primary electron by a retarding potential to be applied to the target object surface from an energy Ea of a primary electron by an acceleration voltage. In other words, Es is an acceleration energy of a secondary electron generated on the target object surface.

$$El=Ea-Es \qquad (1)$$

When performing an image acquisition, the landing energy needs to be changed depending on the material of the target object, for example. One of objects to change the landing energy is to inhibit charging of the target object. If defining the yield=(the number of primary electrons applied to the target object surface)/(the number of secondary electrons emitted from the target object surface), when the yield is 1, the number of applied electrons is the same as the number of emitted electrons. Thereby, it becomes electrically 0 (zero), and thus, charging can be inhibited. The conditions of the yield being 1 are dependent on the material (work function) of the target object. Therefore, the landing energy to be applied to the target object needs to be changed.

In the case of image acquisition using a single beam, when adjusting the landing energy, it does not matter whichever of an acceleration voltage and a retarding potential is used for the adjustment. Further, since the number of beams is one, the problem of crosstalk does not occur in the first place.

In contrast, in the image acquisition apparatus using multiple beams, secondary electrons of the multiple beams individually need to be incident on predetermined detection elements of the multi-detector. For transferring secondary electrons to respective detection elements, it is effective to accelerate them. Since the emission energy of each of the secondary electrons is about 1 eV to 50 eV, it is difficult, in the case of using a small energy side, to transfer the secondary electron to the detection element. Therefore, acceleration is performed by applying a retarding voltage. Specifically, by applying a negative voltage to the target object surface to accelerate a secondary electron, a generated secondary electron is given an energy Es for retarding from the target object due to a potential difference between the target object surface and the optical column. Thereby, the secondary electron proceeds to the upstream of the target object surface. Thus, in the multi-beam image acquisition apparatus, preferably, the retarding potential is adjusted in order to adjust the landing energy of a primary electron. Consequently, since the acceleration energy Es for secondary electrons changes, the trajectory of the secondary electrons changes. Thereby, as described below, it may be impossible to focus to form an image at a desired position depending on the amount of landing energy. Further, even if it is possible to focus to form an image at a desired position, the problem of crosstalk may occur.

Figure 3:
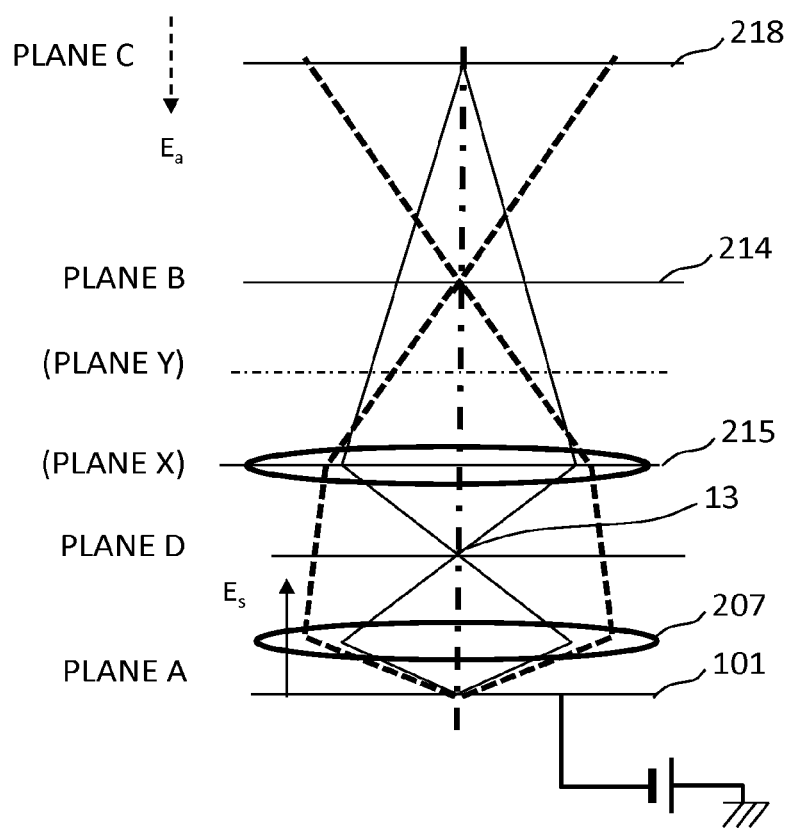
FIG. 3 is an illustration showing an example of a primary electron beam trajectory and a secondary electron beam trajectory according to a comparative example of the first embodiment.

FIG. 3 is an illustration showing an example of a primary electron beam trajectory and a secondary electron beam trajectory according to a comparative example of the first embodiment. In the case of FIG. 3, the dotted line shows a trajectory of a central primary electron beam in the multiple primary electron beams 20, and the solid line shows a trajectory of a central secondary electron beam in the multiple secondary electron beams. In this comparative example, an optical system is configured such that two lenses of the electromagnetic lens 215 (pre objective lens) and the electromagnetic lens 207 (objective lens) are arranged between the ExB separator 214 and the substrate 101. Further, a retarding voltage is applied to the substrate 101.

The central primary electron beam, passing through the ExB separator 214 arranged at the intermediate image plane position (plane B), is refracted, while spreading, by the electromagnetic lens 215 (pre objective lens) arranged in the plane X and the electromagnetic lens 207 (objective lens), and focused to form an image on the substrate 101 arranged in the plane A. Further, each primary electron beam other than the central primary electron beam is also focused to form an image on the substrate 101. Then, multiple secondary electron beams are emitted from the substrate to which a negative retarding potential has been applied. The secondary electron beam is accelerated up to the energy Es by the retarding potential. During or after the acceleration, the secondary electron beam proceeds to the electromagnetic lens 207 (objective lens) and forms an intermediate image plane 13 in the plane D by the electromagnetic lens 207 (objective lens). After forming the intermediate image plane 13, the secondary electron beam proceeds, while spreading, to the electromagnetic lens 215 (pre objective lens) arranged in the plane X. Then, the secondary electron beam forms an intermediate image plane at the position of the plane C, which is the intermediate position of the deflector 218, by the electromagnetic lens 215 (pre objective lens).

This optical system also performs adjustment such that the landing energy El is reduced to similarly form an intermediate image plane of each secondary electron beam at the position of the plane C.

FIGS. 4A to 4D are graphs each showing an example of change of a ratio of a beam pitch to a beam diameter according to a comparative example of the first embodiment. FIG. 4B shows a focusing (image forming) position and a ratio (P/D) of a beam pitch to a beam diameter in the case of, in a large landing energy state, focusing the multiple primary electron beams 20 to form an image on the substrate (plane A), and focusing the multiple secondary electron beams 300 to form an image at the position in the plane C (namely, in the case of forming an intermediate image plane). At the position of the plane C, since P/D is around 1.8, a sufficient beam pitch can be acquired. In contrast, in a small landing energy state, as shown in FIG. 4A, the position of the plane C may be included in a region where focusing for image formation cannot be achieved. If using two electromagnetic lenses whose positions are fixed, a region where no focusing for image formation can be achieved exists depending on the amount of landing energy. Therefore, in the case of FIG. 4A, the position of the plane C needs to be further away from the plane B in order to achieve focusing (image forming). However, it is difficult to move the position of the deflector 218 in the plane C whenever the landing energy changes. Further, if the deflector 218 is arranged away from the plane C, a large space for the separating optical system needs to be obtained, which restricts the design. Therefore, it is preferable that the plane C is closer to the plane B as much as possible.

Now, with respect to the case of FIG. 3, the electromagnetic lens 215 (pre objective lens) is arranged in the plane Y which is close to the ExB separator 214. Then, similarly to what is described above, the multiple primary electron beams 20 are focused to form an image on the substrate (plane A), and the multiple secondary electron beams 300 are focused to form an image in the plane C. Consequently, as shown in FIG. 4C, in a small landing energy state, the position of the plane C can be located out of the region where focusing for image formation cannot be achieved. Therefore, in a small landing energy state, it becomes possible to focus the multiple primary electron beams 20 to form an image on the substrate (plane A), and focus the multiple secondary electron beams to form an image in the plane C. Further, the ratio (P/D) of the beam pitch to the beam diameter at the position of the plane C can be increased to around 2.3.

However, by locating the electromagnetic lens 215 (pre objective lens) in the plane Y, the ratio (P/D) of the beam pitch to the beam diameter at the position of the plane C is about 1.3, namely close to 1, in a large landing energy state as shown in FIG. 4D. This is because the beam pitch largely changes to the change of the beam diameter. Consequently, it becomes difficult to individually detect a secondary electron beam in each detection element of the multi-detector 222. Therefore, there is a problem that a crosstalk may occur between the beams of the multiple secondary electron beams.

Thus, the position of the electromagnetic lens 215 (pre objective lens) is desirably located low in a large landing energy state, and located high in a small landing energy state. Then, according to the first embodiment, as a pre objective lens, the multi-stage electromagnetic lens 217 of two or more stages having different heights is arranged.

FIGS. 5A and 5B are illustrations showing an example of a trajectory of a primary electron beam and that of a secondary electron beam according to the first embodiment. In FIG. 5A, for example, the electromagnetic lens 215*a* of the multi-stage electromagnetic lens 217 is arranged at the position of the plane Y, and the electromagnetic lens 215*b* of the multi-stage electromagnetic lens 217 is arranged at the position of the plane X. Then, as shown in FIG. 5A, in a large landing energy state, it is excited such that the lens principal plane of the multi-stage electromagnetic lens 217 is located at the center height position (plane X) of the electromagnetic lens 215*b*. In contrast, as shown in FIG. 5B, in a small landing energy state, it is excited such that the lens principal plane of the multi-stage electromagnetic lens 217 is located at the center height position (plane Y) of the electromagnetic lens 215*a*.

Figure 6A:
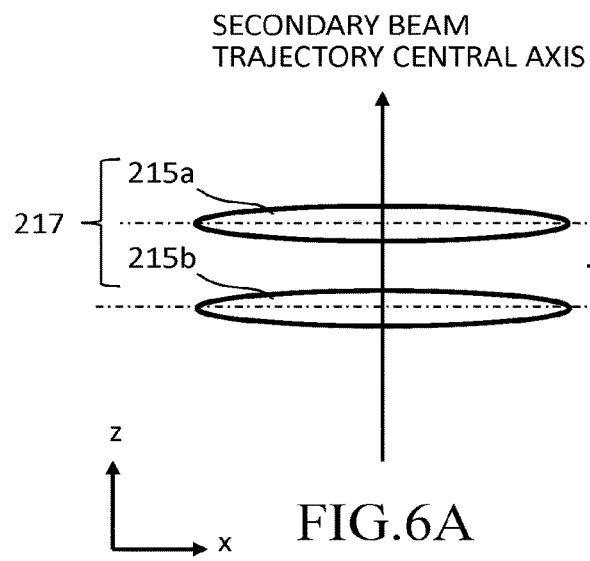
FIGS. 6A and 6B are illustrations showing an example of a magnetic field center position of each lens and a composite magnetic field center position according to the first embodiment.
Figure 6B:
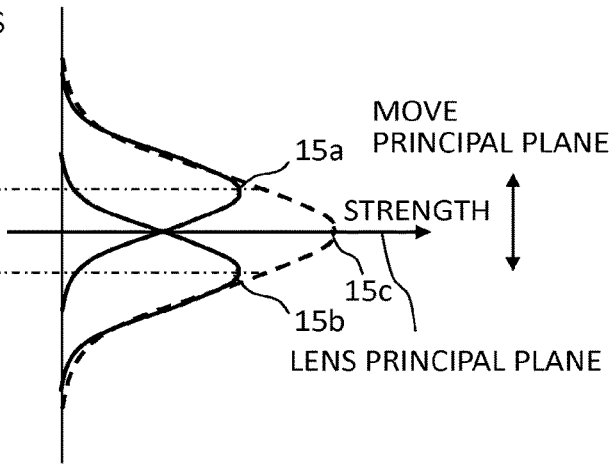

FIGS. 6A and 6B are illustrations showing an example of a magnetic field center position of each lens and a composite magnetic field center position according to the first embodiment. As shown in FIG. 6A, for example, the two-stage lens composed of the electromagnetic lens 215*a* and the electromagnetic lens 215*b* is arranged as the multi-stage electromagnetic lens 217. FIG. 6B shows a composite magnetic field distribution by a magnetic field distribution of the electromagnetic lens 215*a* and that of the electromagnetic lens 215*b*. If the lens strength of the electromagnetic lens 215*a* and that of the electromagnetic lens 215*b* are set to be the same (1:1), the z-direction position of a composite magnetic field center 15*c* of the composite magnetic field distribution is an intermediate position between a magnetic field center 15*a* of the magnetic field distribution of the electromagnetic lens 215*a* and a magnetic field center 15*b* of the magnetic field distribution of the electromagnetic lens 215*b*. In the first embodiment, the z-direction position of the composite magnetic field center 15*c* of the composite magnetic field distribution is assumed to be the position of the lens principal plane of the multi-stage electromagnetic lens 217.

Figure 7A:
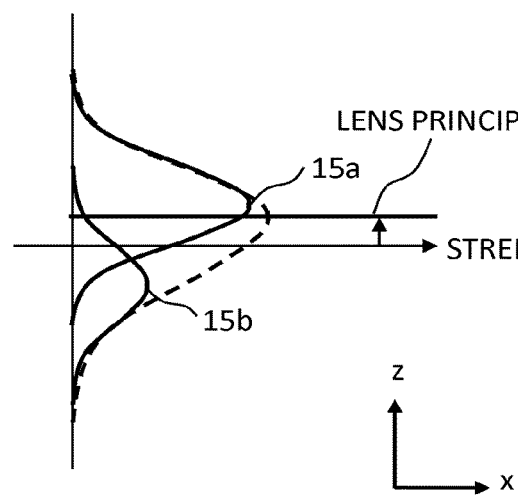
FIGS. 7A and 7B are illustrations showing another example of a magnetic field center position of each lens and a composite magnetic field center position according to the first embodiment.
Figure 7B:
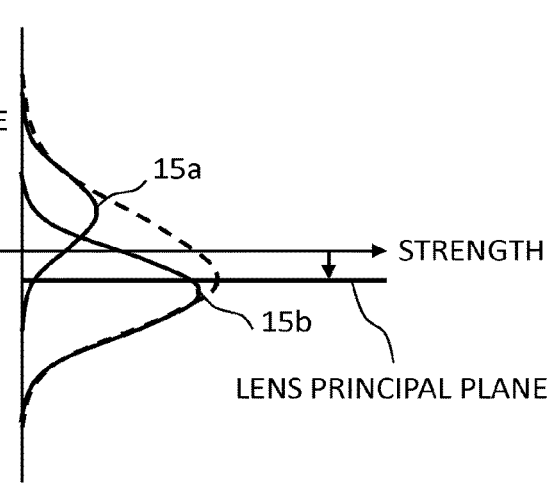

FIGS. 7A and 7B are illustrations showing another example of a magnetic field center position of each lens and a composite magnetic field center position according to the first embodiment. FIG. 7A shows the case where the lens strength of the electromagnetic lens 215*b* is smaller than that of the electromagnetic lens 215*a*. The z-direction position of the composite magnetic field center 15*c* of the composite magnetic field distribution can be moved to the magnetic field center 15*a* side of the magnetic field distribution of the electromagnetic lens 215*a*. In contrast, FIG. 7B shows the case where the lens strength of the electromagnetic lens 215*a* is smaller than that of the electromagnetic lens 215*b*. The z-direction position of the composite magnetic field center 15*c* of the composite magnetic field distribution can be moved to the magnetic field center 15*b* side of the magnetic field distribution of the electromagnetic lens 215*b*. In the cases of FIGS. 6A, 6B, 7A, and 7B, the z-direction position of the composite magnetic field center 15*c* of the composite magnetic field distribution can be adjusted between the magnetic field center 15*a* of the magnetic field distribution of the electromagnetic lens 215*a*, and the magnetic field center 15*b* of the magnetic field distribution of the electromagnetic lens 215*b*. Thus, the z-direction position of the composite magnetic field center 15*c* of the composite magnetic field distribution is variably adjustable according to a ratio between the lens strength of the electromagnetic lens 215*a* and that of the electromagnetic lens 215*b*. In other words, the position of the lens principal plane of the multi-stage electromagnetic lens 217 can be variably adjusted. Thus, according to the first embodiment, the position of the lens principal plane of the multi-stage electromagnetic lens 217 is variably adjusted according to the amount of landing energy.

Figure 8:
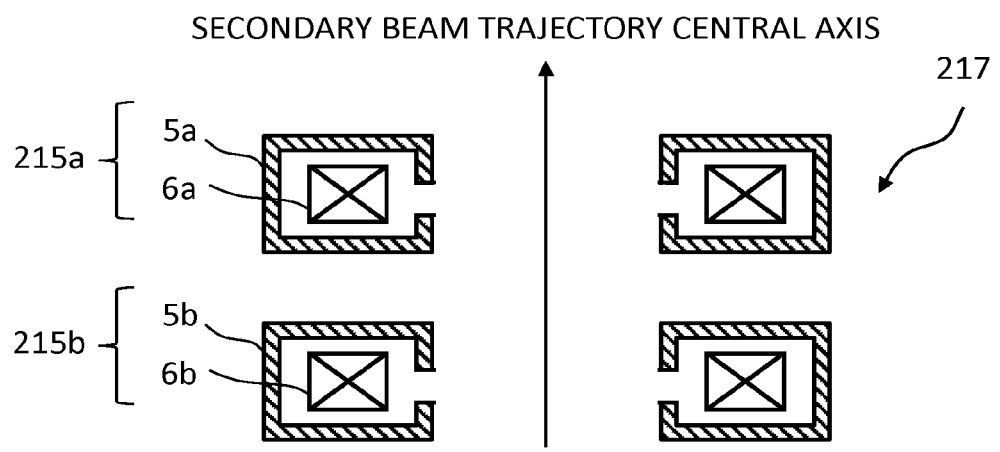
FIG. 8 is an illustration showing an example of a configuration of a multi-stage electromagnetic lens according to the first embodiment.

FIG. 8 is an illustration showing an example of a configuration of a multi-stage electromagnetic lens according to the first embodiment. In FIG. 8, a multi-stage electromagnetic lens (two or more lens group) includes a plurality of pole pieces 5*a* and 5*b* disposed at different height positions, and a plurality of coils 6*a* and 6*b* each individually arranged in a corresponding one of the pole pieces 5*a* and 5*b*. Specifically, in the case of FIG. 8, electromagnetic lenses are arranged in a two-stage array, where a coil 6 for configuring a lens for one stage is arranged in one pole piece 5. In FIG. 8, the first stage electromagnetic lens 215*a* includes a pole piece 5*a* and a coil 6*a*. The second stage electromagnetic lens 215*b* includes a pole piece 5*b* and a coil 6*b*. Thus, an individual pole piece 5 is arranged for each coil 6.

Figure 9:
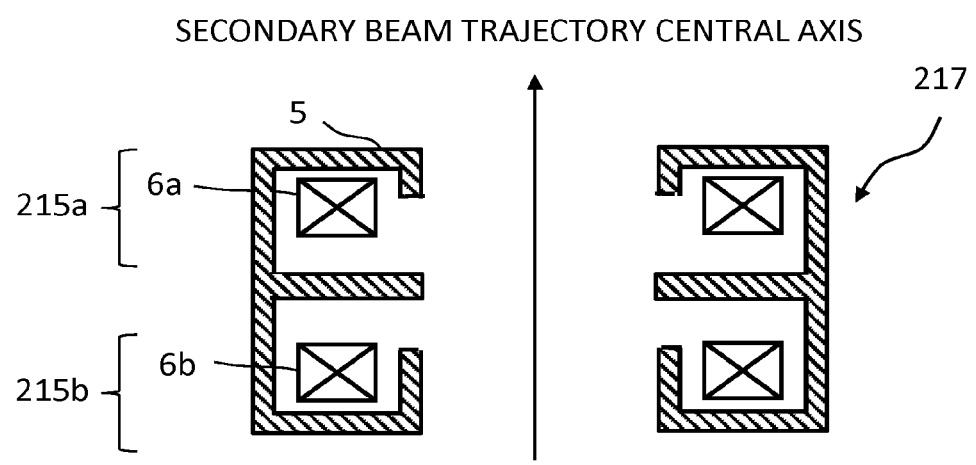
FIG. 9 is an illustration showing another example of a configuration of a multi-stage electromagnetic lens according to the first embodiment.

FIG. 9 is an illustration showing another example of a configuration of a multi-stage electromagnetic lens according to the first embodiment. In FIG. 9, the multi-stage electromagnetic lens (two or more lens group) includes a common pole piece 5, and a plurality of coils 6*a* and 6*b* arranged at different height positions in the common pole piece 5. In other words, in the case of FIG. 9, the coils 6*a* and 6*b* of a two-stage array having different height positions are arranged in the common pole piece 5. The first stage electromagnetic lens 215*a* is composed of the common pole piece 5 and the coil 6*a*. The second stage electromagnetic lens 215*b* is composed of the common pole piece 5 and the coil 6*b*. Thus, the common pole piece 5 which can separate the coils 6 may be arranged for each coil 6.

Figure 10:
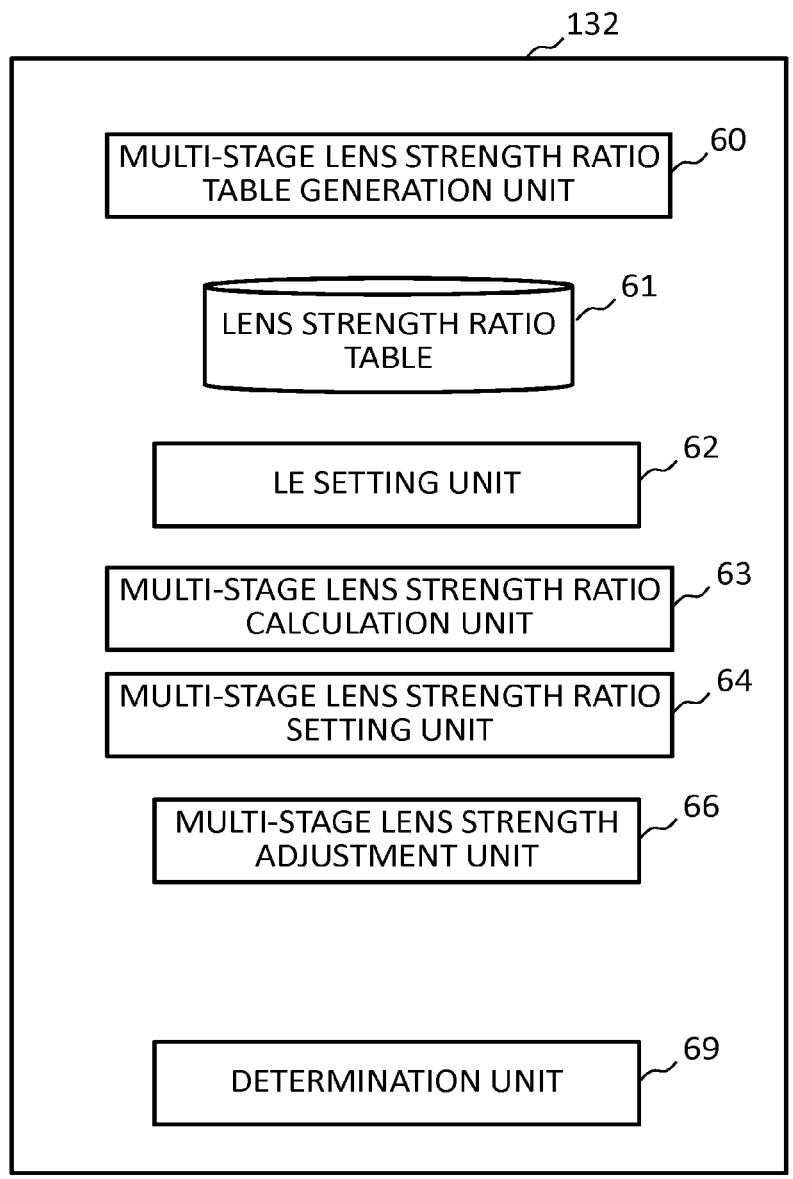
FIG. 10 is a block diagram showing an example of an internal configuration of a multi-stage lens adjustment circuit according to the first embodiment.

FIG. 10 is a block diagram showing an example of an internal configuration of a multi-stage lens adjustment circuit according to the first embodiment. In FIG. 10, in the multi-stage lens adjustment circuit 132, there are arranged a storage device 61 such as a magnetic disk drive, a multi-stage lens strength ratio table generation unit 60, a landing energy LE setting unit 62, a multi-stage lens strength ratio calculation unit 63, a multi-stage lens strength ratio setting unit 64, a multi-stage lens strength adjustment unit 66, and a determination unit 69. Each unit " . . . ", such as the multi-stage lens strength ratio table generation unit 60, the landing energy LE setting unit 62, the multi-stage lens strength ratio calculation unit 63, the multi-stage lens strength ratio setting unit 64, the multi-stage lens strength adjustment unit 66, and the determination unit 69 includes processing circuitry. The processing circuitry includes an electric circuit, a computer, a processor, a circuit board, a quantum circuit, a semiconductor device, or the like. Further, common processing circuitry (the same processing circuitry), or different processing circuitry (separate processing circuitry) may be used for each unit " . . . ". Input data necessary for the multi-stage lens strength ratio table generation unit 60, the landing energy LE setting unit 62, the multi-stage lens strength ratio calculation unit 63, the multi-stage lens strength ratio setting unit 64, the multi-stage lens strength adjustment unit 66, and the determination unit 69, and operated (calculated) results are stored in a memory (not shown) or in the memory 118 each time.

Figure 11:
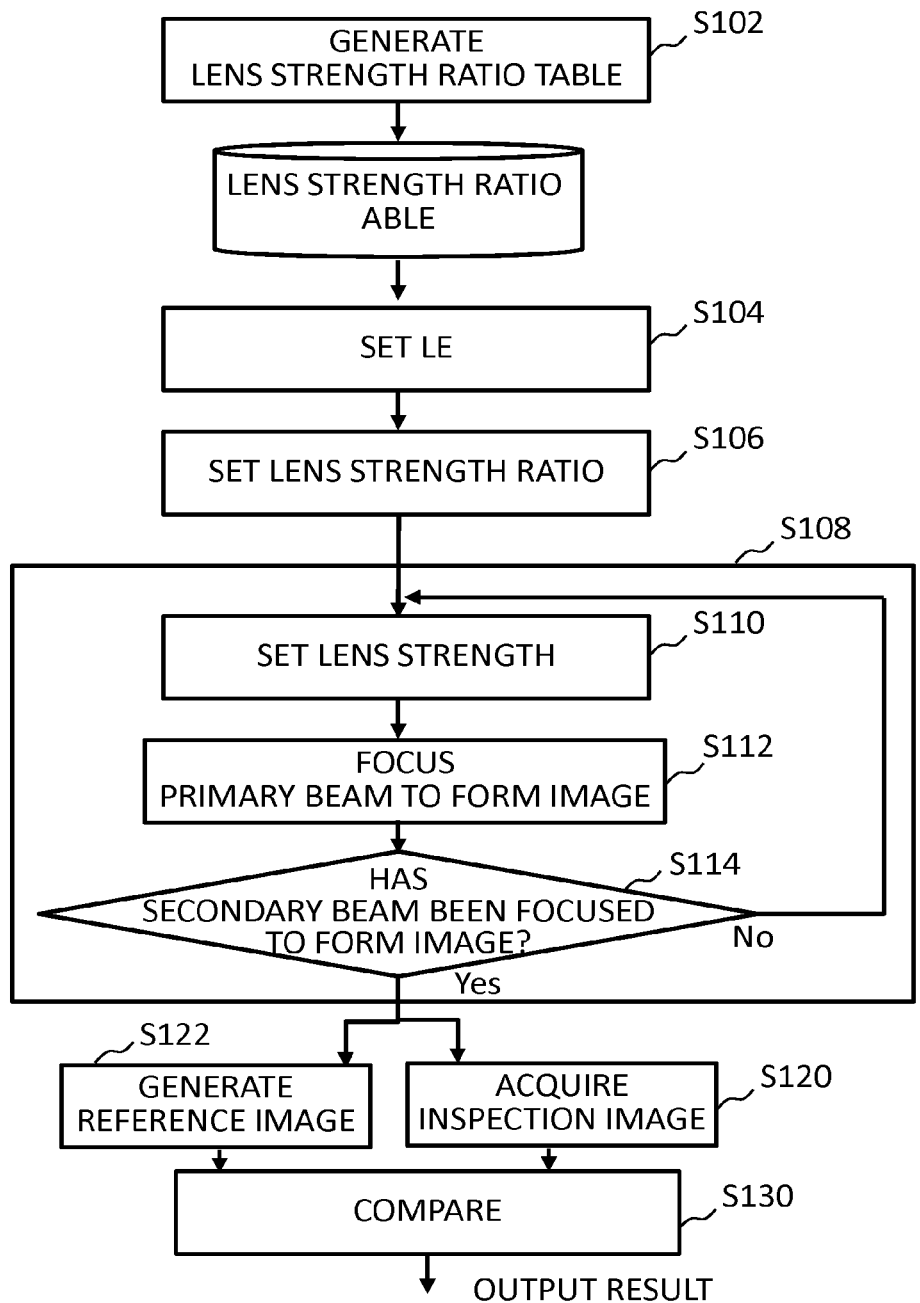
FIG. 11 is a flowchart showing an example of main steps of an inspection method according to the first embodiment.

FIG. 11 is a flowchart showing an example of main steps of an inspection method according to the first embodiment. In FIG. 11, the inspection method of the first embodiment executes a series of steps: a lens strength ratio table generation step (S102), a landing energy LE setting step (S104), a multi-stage lens strength ratio setting step (S106), a multi-stage lens strength adjustment step (S108), an inspection image acquisition step (S120), a reference image generation step (S122), and a comparison step (S130). The multi-stage lens strength adjustment step (S108) executes, as internal steps, a multi-stage lens strength setting step (S110), a primary beam focusing (image forming) step (S112), and a determination step (S114).

In the lens strength ratio table generation step (S102), first, an evaluation substrate is placed on the stage 105. A desired evaluation pattern is arranged on the evaluation substrate. For example, a dot pattern and/or a line and space pattern is arranged. Then, using the inspection apparatus 100, for each landing energy LE, measured are the lens strength of the electromagnetic lens 207 (objective lens) which can focus the multiple primary electron beams 20 to form an image on the evaluation substrate (plane A), and focus the multiple secondary electron beams 300 to form an image at a desired position (plane C), and the lens strength of each of the electromagnetic lenses 215a and 215b being stages of the multi-stage electromagnetic lens 217 (pre objective lens). As shown in FIGS. 6A, 6B, 7A, and 7B, with respect to the multi-stage electromagnetic lens 217, the peak position 15c of the composite magnetic field distribution can be variably adjusted in the direction of the trajectory central axis, that is the z direction, of the multiple secondary electron beams 300. Then, the lens strength of each of the electromagnetic lenses 215a and 215b is adjusted such that the peak position 15c of the composite magnetic field distribution of the multi-stage electromagnetic lens 217 is located at a height position where the multi-stage electromagnetic lens 217 can perform focusing to form an image, according to the landing energy LE. For example, when the landing energy is large, the height position is adjusted in the z direction such that the height of the peak position 15c of the composite magnetic field distribution of the multi-stage electromagnetic lens 217 becomes higher. For example, when the landing energy is small, the height position is adjusted in the z direction such that the height of the peak position 15c of the composite magnetic field distribution of the multi-stage electromagnetic lens 217 becomes lower.

In this process, a combination, between the beam pitch and the beam diameter, which leads the ratio (P/D) of the beam pitch to the beam diameter at the position in the plane C to be equal to or greater than a threshold is acquired. As the threshold, 1.5 is used, for example. In the case of FIG. 1, an intermediate position of the deflector 218 is used as the plane C. Further, since the multi-detector 222 is located at a conjugate position to the plane C, it can be used to measure whether focusing to form an image has been achieved. Alternatively, a detector (not shown) may be arranged at the intermediate position of the deflector 218. The lens strength of the electromagnetic lens 207 (objective lens) and the lens strength of each of the electromagnetic lenses 215a and 215b being stages of the multi-stage electromagnetic lens 217 (pre objective lens) are obtained for each landing energy LE by experiment or simulation. The landing energy LE is adjusted by changing a retarding potential. Each data, obtained for each landing energy, on the lens strength of the electromagnetic lens 207 (objective lens) and the lens strength of each of the electromagnetic lenses 215a and 215b being stages of the multi-stage electromagnetic lens 217 (pre objective lens) is output to the multi-stage lens adjustment circuit 132. Each data is stored in the storage device 61, for example, in the multi-stage lens adjustment circuit 132.

The multi-stage lens strength ratio table generation unit 60 calculates, for each landing energy LE, a ratio of the lens strength of each of the electromagnetic lenses 215a and 215b being stages of the multi-stage electromagnetic lens 217 (pre objective lens). Then, a lens strength ratio table is generated in which a calculated lens strength ratio, for each landing energy LE, of each of the electromagnetic lenses 215a and 215b being stages of the multi-stage electromagnetic lens 217 (pre objective lens) is defined. The generated lens strength ratio table is stored in the storage device 61. An excitation current value may be used as a parameter indicating a lens strength. Alternatively, it is also preferable to use a coefficient for an excitation current value serving as a reference. Alternatively, other calculated values may be used.

Before acquiring an image of the substrate 101 to be inspected, the lens strength ratio table is generated in advance.

Then, the substrate 101 to be inspected is located on the stage 105.

In the landing energy LE setting step (S104), the landing energy LE setting unit 62 sets a landing energy LE depending on the substrate 101. For example, it is preferable to determine a desirable or optimal landing energy LE in advance for each material of the substrate 101. As the optimal landing energy LE, for example, when the substrate 101 is irradiated with the multiple primary electron beams 20 at a desired acceleration voltage, a landing energy LE at which a detected intensity of emitted multiple secondary electron beams is equal to or greater than a threshold can be the optimal one.

In the lens strength ratio setting step (S106), first, referring to the lens strength ratio table, the multi-stage lens strength ratio calculation unit 63 calculates a lens strength ratio, corresponding to a landing energy LE having been set, of each of the electromagnetic lenses 215a and 215b being stages of the multi-stage electromagnetic lens 217. Then, the multi-stage lens strength ratio setting unit 64 sets the calculated lens strength ratio of each of the electromagnetic lenses 215a and 215b of the calculated multi-stage electromagnetic lens 217.

In the multi-stage lens strength adjustment step (S108), in a state where the set lens strength ratio is maintained, the multi-stage lens strength adjustment unit 66 adjusts the strength of each of the electromagnetic lenses 215a and 215b (two or more lens group) being stages of the multi-stage electromagnetic lens 217. Specifically, it operates as follows:

In the multi-stage lens strength setting step (S110), in a state where the set lens strength ratio is maintained, the multi-stage lens strength adjustment unit 66 sets, in the lens control circuit 124, a temporary lens strength of each of the electromagnetic lenses 215a and 215b being stages of the multi-stage electromagnetic lens 217.

In the primary beam focusing (image forming) step (S112), under the control of the lens control circuit 124, the electromagnetic lens 207 (first electromagnetic lens) focuses the multiple primary electron beams 20 to form an image on the substrate 101.

In the determination step (S114), in a state where the multiple primary electron beams 20 have been focused to form an image on the substrate 101, the determination unit 69 determines whether the multiple secondary electron beams 300 have been focused to form an image at a desired position (plane C: intermediate position of the deflector 218).

If the multiple secondary electron beams 300 have not been focused to form an image at the desired position (plane C: intermediate position of the deflector 218), it returns to the multi-stage lens strength setting step (S110). Then, in the multi-stage lens strength setting step (S110), the multi-stage lens strength adjustment unit 66 changes, in a state where the set lens strength ratio is maintained, the lens strength of each of the electromagnetic lenses 215a and 215b, and sets the changed lens strength in the lens control circuit 124. Then, the primary beam focusing (image forming) step (S112) and the determination step (S114) are executed. Each step from the multi-stage lens strength setting step (S110) to the determination step (S114) is repeated until the multiple secondary electron beams 300 have been focused to form an image at the desired position (plane C: intermediate position of the deflector 218).

When the multiple secondary electron beams 300 have been focused to form an image at the desired position (plane C: intermediate position of the deflector 218), the lens adjustment is completed, and it proceeds to inspection processing.

In the inspection image acquisition step (S120), the image acquisition mechanism 150 applies the multiple primary electron beams 20 to the substrate 101, and acquires a secondary electron image of the substrate 101 formed by the multiple secondary electron beams 300 emitted from the substrate 101. As described above, the electromagnetic lens 207 (objective lens) focuses the multiple primary electron beams 20 to form an image on the substrate 101.

The multiple secondary electron beams 300 are emitted from the substrate 101 due to the irradiation with the multiple primary electron beams 20.

Then, the electromagnetic lens 207 (first electromagnetic lens) focuses the multiple secondary electron beams 300 in the state before being separated from the multiple primary electron beams 20. In other words, before being separated from the multiple primary electron beams 20, the multiple secondary electron beams 300 form an intermediate image plane by the lens action of the electromagnetic lens 207. The multi-stage electromagnetic lens 217 (second electromagnetic lens) is arranged between the image forming point on which the multiple secondary electron beams are focused by the electromagnetic lens 207, and the E×B separator 214. The multi-stage electromagnetic lens 217 focuses the multiple secondary electron beams 300 to form an image at the position (plane C) conjugate to the detection surface of the multi-detector 222. In the case of FIG. 1, after forming an intermediate image plane in the plane C, the multiple secondary electron beams 300 are focused to form an image on the detection surface of the multi-detector 222, but it is not limited thereto. The multi-stage electromagnetic lens 217 may focus the multiple secondary electron beams 300 to form an image on the detection surface of the multi-detector 222.

As described above, after being separated from the multiple primary electron beams 20 by the E×B separator 214, the multiple secondary electron beams 300 are focused to form an image at the intermediate position (plane C) of the deflector 218.

The multiple secondary electron beams 300 are further bent by the deflector 218, and proceed to the electromagnetic lens 224. Then, the multiple secondary electron beams 300 are projected onto the multi-detector 222 while being refracted by the electromagnetic lens 224. The multi-detector 222 detects the projected multiple secondary electron beams 300.

FIG. 12 is an illustration showing an example of a plurality of chip regions formed on a semiconductor substrate, according to the first embodiment. In FIG. 12, in the case of the substrate 101 being a semiconductor substrate (wafer), a plurality of chips (wafer dies) 332 are formed in a two-dimensional array in an inspection region 330 of the semiconductor substrate (wafer). A mask pattern for one chip formed on an exposure mask substrate is reduced to, for example, ¼, and exposed/transferred onto each chip 332 by an exposure device such as a stepper (not shown). The mask pattern for one chip is generally composed of a plurality of figure patterns.

Figure 13:
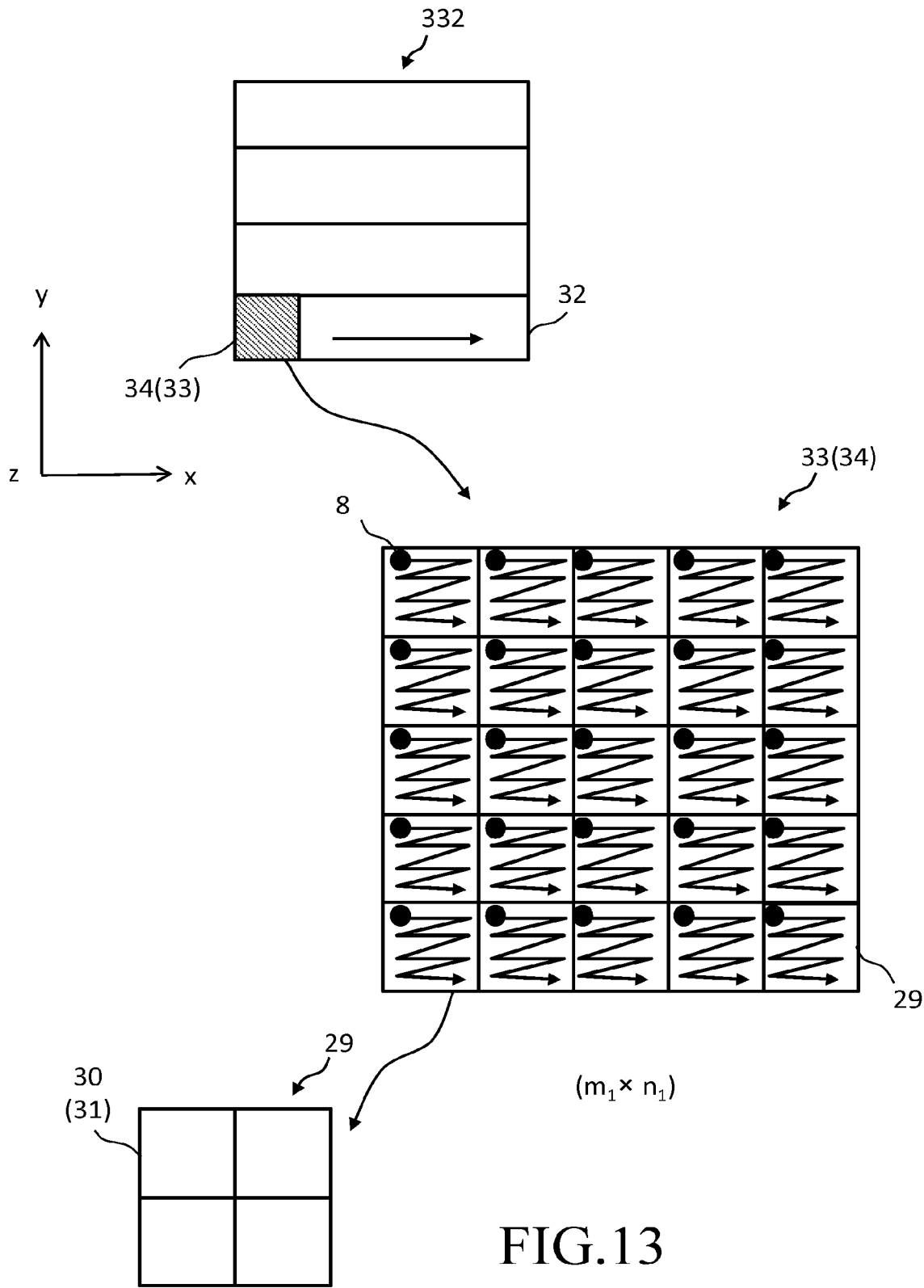
FIG. 13 is an illustration describing inspection processing according to the first embodiment.

FIG. 13 is an illustration describing inspection processing according to the first embodiment. As shown in FIG. 13, the region of each chip 332 is divided, for example, in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the −x direction, for example. Each stripe region 32 is divided in the longitudinal direction into a plurality of rectangular (including square) regions 33. Beam application to a target rectangular region 33 is achieved by collectively deflecting all the multiple primary electron beams 20 by the main deflector 208.

The case of FIG. 13 shows the multiple primary electron beams 20 of 5 rows×5 columns, for example. The size of an irradiation region 34 which can be irradiated by one irradiation with the multiple primary electron beams 20 is defined by (x direction size obtained by multiplying an x-direction beam pitch of the multiple primary electron beams 20 on the substrate 101 by the number of beams in the x direction)×(y direction size obtained by multiplying a y-direction beam pitch of the multiple primary electron beams 20 on the substrate 101 by the number of beams in the y direction). The irradiation region 34 serves as a field of view of the multiple primary electron beams 20. The inside of a sub-irradiation region 29 is irradiated and scanned with each primary electron beam 8 of the multiple primary electron beams 20, where the sub-irradiation region 29 is surrounded by the beam pitch in the x direction and the beam pitch in the y direction and the beam concerned itself is located therein. Each primary electron beam 8 is associated with any one of the sub-irradiation regions 29 which are different from each other. At the time of each shot, each primary electron beam 8 is applied to the same position in the associated sub-irradiation region 29. The primary electron beam 8 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 8.

Preferably, the width of each stripe region 32 is set to be the same as the size in the y direction of the irradiation region 34, or to be the size reduced by the width of the scanning margin. In the cases of FIGS. 4A to 4D, the irradiation region 34 and the rectangular region 33 are of the same size. However, it is not limited thereto. The irradiation region 34 may be smaller than the rectangular region 33, or larger than it. Using each primary electron beam 8 of the multiple primary electron beams 20, the sub-irradiation region 29, in which the primary electron beam 8 concerned itself is located, is irradiated with the primary electron beam 8 concerned, and scanned by collectively deflecting all the multiple primary electron beams 20 by the sub deflector 209. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation region 34 is moved to the next stripe region 32 by moving the stage 105 and/or by collectively deflecting all of the multiple primary electron beams 20 by the main deflector 208. As described above, by irradiation with each primary electron beam 8, the scanning operation per sub-irradiation region 29 and acquisition of a secondary electron image are performed. By combining secondary electron images of respective sub-irradiation regions 29, a secondary electron image of the rectangular region 33, a secondary electron image of the stripe region 32, or a secondary electron image of the chip 332 is configured. When an image comparison is actually performed, the sub-irradiation region 29 in each rectangular region 33 is further divided into a plurality of frame regions 30, and a frame image 31 of each frame region 30 is compared. FIG. 13 shows the case of dividing the sub-irradiation region 29 which is scanned with one primary electron beam 8 into four frame regions 30 by halving it in the x and y directions.

As described above, the image acquisition mechanism 150 proceeds with a scanning operation per stripe region 32. The multiple secondary electron beams 300 emitted from the substrate 101 due to the irradiation with the multiple primary electron beams 20 is detected by the multi-detector 222. A reflected electron may be included in the detected multiple secondary electron beams 300. Alternatively, a reflected electron may be separated during moving in the secondary electron optical system 152 and therefore may not reach the multi-detector 222. Detected data (measured image data: secondary electron image data: inspection image data) on the secondary electron of each pixel in each sub-irradiation region 29, detected by the multi-detector 222, is output to the detection circuit 106 in order of measurement. In the detection circuit 106, the detected data in analog form is converted into digital data by an A-D converter (not shown), and stored in the chip pattern memory 123. Then, acquired measured image data is transmitted to the comparison circuit 108, together with information on each position from the position circuit 107.

Since the inside of the sub irradiation region 29 is scanned with the multiple primary electron beams 20, the emission position of each secondary electron beam changes every second in the sub-irradiation region 29. Therefore, if left as is, each secondary electron beam is projected onto a position deviated from a corresponding detection element of the multi-detector 222. Then, it is necessary that the deflector 226 collectively deflects the multiple secondary electron beams 300 so that each secondary electron beam whose emission position has changed as described above may irradiate a corresponding detection region of the multi-detector 222. In order to make each secondary electron beam irradiate a corresponding detection region of the multi-detector 222, deflection for swinging back (cancelling) a movement of the position of the multiple secondary electron beams caused by the change of the emission position needs to be performed.

Figure 14:
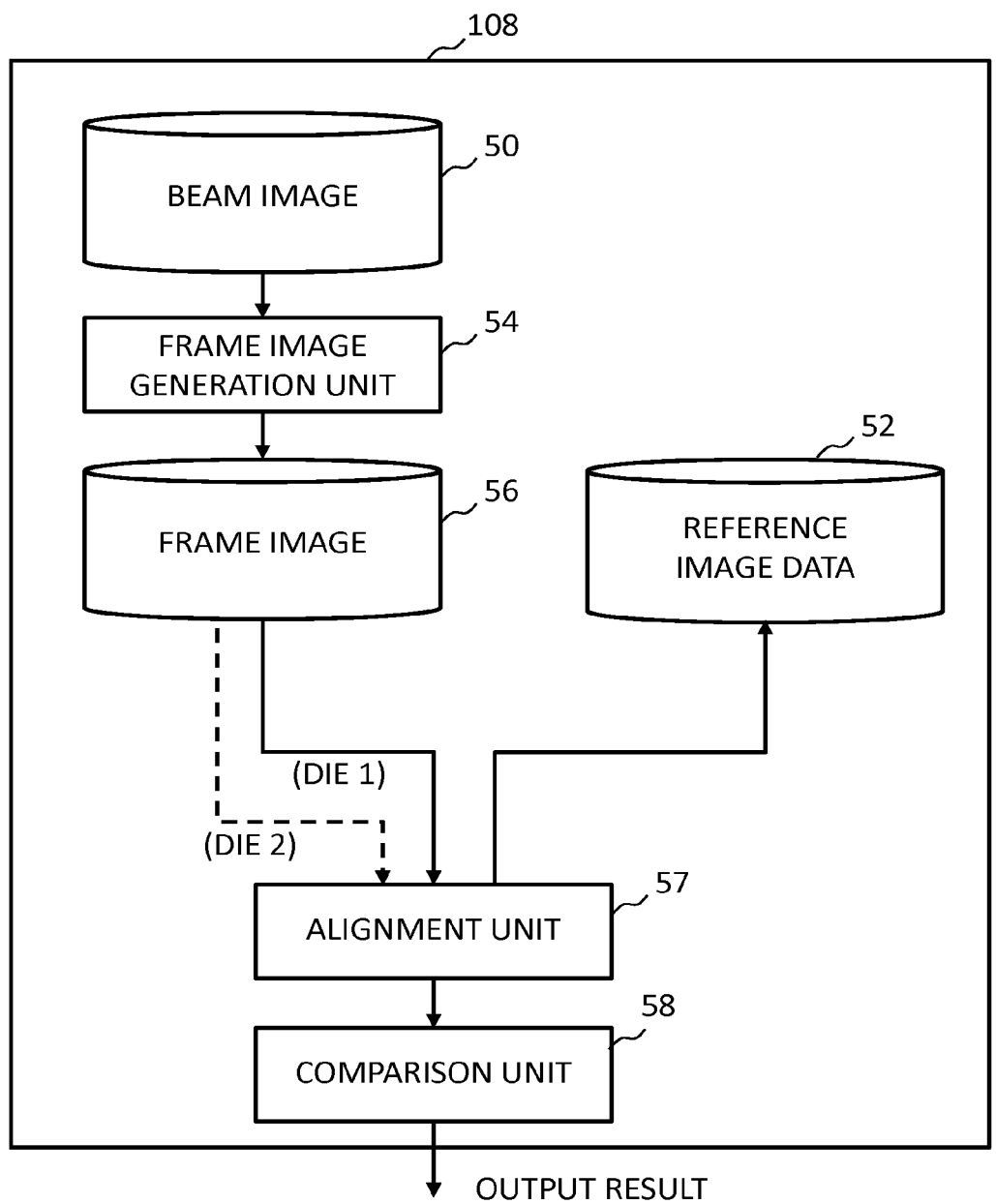
FIG. 14 is a diagram showing an example of an internal configuration of a comparison circuit according to the first embodiment.

FIG. 14 is a diagram showing an example of an internal configuration of a comparison circuit according to the first embodiment. In FIG. 14, storage devices 50, 52 and 56 such as magnetic disk drives, a frame image generation unit 54, an alignment unit 57, and a comparison unit 58 are arranged in the comparison circuit 108. Each of the "units" such as the frame image generation unit 54, the alignment unit 57 and the comparison unit 58 includes processing circuitry. The processing circuitry includes an electric circuit, a computer, a processor, a circuit board, a quantum circuit, a semiconductor device, or the like. Further, common processing circuitry (same processing circuitry), or different processing circuitry (separate processing circuitry) may be used for each of the "units". Input data required in the frame image generation unit 54, the alignment unit 57 and the comparison unit 58, or a calculated result is stored in a memory (not shown) or in the memory 118 each time.

Measured image data (beam image) transmitted into the comparison circuit 108 is stored in the storage device 50.

The frame image generation unit 54 generates the frame image 31 of each of a plurality of frame regions 30 obtained by further dividing image data of the sub-irradiation region 29 acquired by scanning with each primary electron beam 8. The frame region 30 is used as a unit region of an inspection image. In order to prevent missing an image, it is preferable that margin regions overlap each other with respect to respective frame regions 30. The generated frame image 31 is stored in the storage device 56.

In the reference image generation step (S122), the reference image generation circuit 112 generates, for each frame region 30, a reference image corresponding to the frame image 31, based on design data serving as a basis of a plurality of figure patterns formed on the substrate 101. Specifically, it operates as follows: First, design pattern data is read from the storage device 109 through the control computer 110, and each figure pattern defined by the read design pattern data is converted into image data of binary or multiple values.

As described above, basic figures defined by the design pattern data are, for example, rectangles (including squares) and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data used as the figure data is input to the reference image generation circuit 112, the data is developed/expanded into data for each figure. Then, with respect to each figure data, the figure code, the figure dimensions, and the like indicating the figure shape of each figure data are interpreted. The reference image generation circuit 112 develops each figure data to design pattern image data in binary or multiple values as a pattern to be arranged in squares in units of grids of predetermined quantization dimensions, and outputs the developed data. In other words, the reference image generation circuit 112 reads design data, calculates the occupancy of a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^9(=1/256)$, the occupancy rate in each pixel is calculated by allocating sub regions which correspond to the region of figures arranged in the pixel concerned and each of which corresponds to a $1/256$ resolution. Then, the 8-bit occupancy rate data is output to the reference image generation circuit 112. Such square regions (inspection pixels) can be commensurate with pixels of measured data.

Next, the reference image generation circuit 112 performs filtering processing on design image data of a design pattern which is image data of a figure, using a predetermined filter function. Thereby, it becomes possible to match/fit the design image data being design side image data, whose image intensity (gray scale level) is represented by digital values, with image generation characteristics obtained by irradiation with the multiple primary electron beams 20. Image data for each pixel of a generated reference image is output to the comparison circuit 108. The reference image data transmitted into the comparison circuit 108 is stored in the storage device 52.

In the comparison step (S130), first, the alignment unit 57 reads the frame image 31 serving as an inspection image, and a reference image corresponding to the frame image 31, and provides alignment between both the images, based on units of sub-pixels smaller than units of pixels. For example, the alignment can be performed by a least-square method.

Then, the comparison unit 58 compares a secondary electron image, which is an image acquired by detecting multiple secondary electron beams by the multi-detector 222, with a reference image. At least a portion of the acquired secondary electron image is compared with a reference image. Here, a frame image obtained by further dividing the image of the sub-irradiation region 29 acquired for each beam is used. The comparison unit 58 compares, for each pixel, the frame image 31 and the reference image. The comparison unit 58 compares them, for each pixel, based on predetermined determination conditions in order to determine whether there is a defect or a candidate defect such as a shape defect. For example, if a difference in gray scale level for each pixel is larger than a determination threshold Th, it is determined that there is a defect. Then, the comparison result is output. It may be output to the storage device 109 or the memory 118, or alternatively, output from the printer 119.

In the examples described above, the die-to-database inspection is performed. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) in which there is formed the same pattern as that of the frame image 31 to be inspected.

As described above, according to the first embodiment, it is possible, even when the landing energy is variably adjusted, to focus the multiple secondary electron beams 300 to form an image at a desired position without generating a crosstalk between beams.

In the above description, each " . . . circuit" includes processing circuitry. The processing circuitry includes an electric circuit, a computer, a processor, a circuit board, a quantum circuit, a semiconductor device, or the like. Each " . . . circuit" may use common processing circuitry (the same processing circuitry), or different processing circuitry (separate processing circuitry). Programs for causing a processor, etc. to execute processing may be stored in a recording medium, such as a magnetic disk drive, magnetic tape drive, FD, ROM (Read Only Memory) or the like. For example, the position circuit 107, the comparison circuit 108, the reference image generation circuit 112, the stage control circuit 114, the lens control circuit 124, the blanking control circuit 126, the deflection control circuit 128, the multi-stage lens adjustment circuit 132, the E×B control circuit 133, and the retarding control circuit 134 may be configured by at least one processing circuit described above. For example, the processing in these circuits may be executed by the control computer 110.

Embodiments have been explained referring to specific examples as described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by applying a primary electron beam from each of a plurality of irradiation sources.

While the apparatus configuration, control method, and the like not directly necessary for explaining the present invention are not described, some or all of them can be appropriately selected and used on a case-by-case basis when needed.

Further, any multi-electron beam image acquisition apparatus, multi-electron beam inspection apparatus, and multi-electron beam image acquisition method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-electron beam image acquisition apparatus comprising:
    a stage on which a substrate is to be mounted;
    an emission source configured to emit multiple primary electron beams;
    a first electromagnetic lens configured to focus the multiple primary electron beams to form an image on the substrate;
    a separator configured to separate multiple secondary electron beams, which are emitted from the substrate due to irradiation with the multiple primary electron beams, from the multiple primary electron beams;
    a detector configured to detect the multiple secondary electron beams having been separated; and
    a second electromagnetic lens configured to be controlled to variably adjust a peak position of a magnetic field distribution in a direction of a trajectory central axis of the multiple secondary electron beams, and to focus the multiple secondary electron beams to form an image on either one of a detection surface of the detector and a position conjugate to the detection surface, wherein the first electromagnetic lens focuses, to form an image, the multiple secondary electron beams in a state before being separated from the multiple primary electron beams, and the second electromagnetic lens is arranged between the separator and an image forming point on which the multiple secondary electron beams are focused by the first electromagnetic lens.

2. The apparatus according to claim 1, wherein the second electromagnetic lens is composed of a group of at least two lenses.

3. The apparatus according to claim 2, wherein the group of at least two lenses includes
   a plurality of pole pieces disposed at different height positions, and
   a plurality of coils each individually arranged in a corresponding one of the plurality of pole pieces.

4. The apparatus according to claim 2, wherein the group of at least two lenses includes
   a common pole piece, and
   a plurality of coils arranged at different height positions in the common pole piece.

5. The apparatus according to claim 2, wherein the peak position of the magnetic field distribution is a peak position of a composite magnetic field of at least two magnetic fields generated by the group of at least two lenses.

6. A multi-electron beam inspection apparatus comprising:
   a stage on which a substrate is to be mounted;
   an emission source configured to emit multiple primary electron beams;
   a first electromagnetic lens configured to focus the multiple primary electron beams to form an image on the substrate;
   a separator configured to separate multiple secondary electron beams, which are emitted from the substrate due to irradiation with the multiple primary electron beams, from the multiple primary electron beams;
   a detector configured to detect the multiple secondary electron beams having been separated;
   a second electromagnetic lens configured to be controlled to variably adjust a peak position of a magnetic field distribution in a direction of a trajectory central axis of the multiple secondary electron beams, and to focus the multiple secondary electron beams to form an image on either one of a detection surface of the detector and a position conjugate to the detection surface; and
   a comparison circuit configured to compare an image acquired by detecting the multiple secondary electron beams by the detector with a reference image, wherein
   the first electromagnetic lens focuses, to form an image, the multiple secondary electron beams in a state before being separated from the multiple primary electron beams, and
   the second electromagnetic lens is arranged between the separator and an image forming point on which the multiple secondary electron beams are focused by the first electromagnetic lens.

7. The apparatus according to claim 6, wherein the second electromagnetic lens is composed of a group of at least two lenses.

8. The apparatus according to claim 7, wherein the peak position of the magnetic field distribution is a peak position of a composite magnetic field of at least two magnetic fields generated by the group of at least two lenses.

9. A multi-electron beam image acquisition method comprising:
   emitting multiple primary electron beams;
   focusing, by a first electromagnetic lens, the multiple primary electron beams to form an image on a substrate mounted on a stage;
   separating, by a separator, multiple secondary electron beams, which are emitted from the substrate due to irradiation with the multiple primary electron beams, from the multiple primary electron beams;
   detecting, by a detector, the multiple secondary electron beams having been separated; and
   focusing the multiple secondary electron beams to form an image on either one of a detection surface of the detector and a position conjugate to the detection surface, by using a second electromagnetic lens which can be controlled to variably adjust a peak position of a magnetic field distribution in a direction of a trajectory central axis of the multiple secondary electron beams, wherein
   the first electromagnetic lens focuses, to form an image, the multiple secondary electron beams in a state before being separated from the multiple primary electron beams, and
   the second electromagnetic lens is arranged between the separator and an image forming point on which the multiple secondary electron beams are focused by the first electromagnetic lens.

10. The method according to claim 9, wherein the second electromagnetic lens is composed of a group of at least two lenses, further comprising:
    setting a lens strength ratio of the group of at least two lenses, and
    adjusting, in a state where the lens strength ratio having been set is maintained, a strength of the group of at least two lenses.

* * * * *